(12) United States Patent
Yoshizaki et al.

(10) Patent No.: US 8,636,868 B2
(45) Date of Patent: Jan. 28, 2014

(54) METHOD FOR MANUFACTURING LAMINATED BOARD, AND LAMINATED BOARD

(75) Inventors: Kazuyuki Yoshizaki, Tokyo (JP); Maroshi Yuasa, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 497 days.

(21) Appl. No.: 12/529,710

(22) PCT Filed: Mar. 13, 2008

(86) PCT No.: PCT/JP2008/000573
§ 371 (c)(1),
(2), (4) Date: Sep. 2, 2009

(87) PCT Pub. No.: WO2008/129784
PCT Pub. Date: Oct. 30, 2008

(65) Prior Publication Data
US 2010/0297420 A1  Nov. 25, 2010

(30) Foreign Application Priority Data

Mar. 20, 2007 (JP) .................... 2007-071967
Mar. 20, 2007 (JP) .................... 2007-071969

(51) Int. Cl.
| | | |
|---|---|---|
| B29C 65/00 | (2006.01) |
| B32B 37/00 | (2006.01) |
| B29C 47/76 | (2006.01) |
| B29C 45/00 | (2006.01) |
| B29C 47/00 | (2006.01) |
| B29C 39/02 | (2006.01) |
| B29C 43/02 | (2006.01) |
| B29C 49/00 | (2006.01) |
| B29C 49/08 | (2006.01) |
| B29C 67/00 | (2006.01) |
| B29D 22/00 | (2006.01) |
| B29C 51/00 | (2006.01) |
| B29D 24/00 | (2006.01) |
| B29D 29/00 | (2006.01) |
| B29C 43/10 | (2006.01) |
| B28B 21/36 | (2006.01) |
| A23P 1/00 | (2006.01) |
| B29B 11/06 | (2006.01) |
| B29C 35/00 | (2006.01) |
| A01J 21/00 | (2006.01) |
| A01J 25/12 | (2006.01) |
| A21C 3/00 | (2006.01) |
| A21C 11/00 | (2006.01) |
| A23G 1/20 | (2006.01) |
| A23G 3/02 | (2006.01) |
| B28B 11/08 | (2006.01) |
| B29C 55/28 | (2006.01) |

(52) U.S. Cl.
USPC ........... 156/285; 156/286; 156/382; 264/511; 264/526; 264/553; 264/571; 264/101; 264/102; 425/504; 425/546; 425/388; 425/405.1; 425/405.2

(58) Field of Classification Search
USPC ............ 156/285, 286, 382; 264/87, 511, 526, 264/553, 571, 101, 102; 425/504, 546, 388, 425/405.1, 405.2
See application file for complete search history.

(56) References Cited

U.S. PATENT DOCUMENTS

| | | | | |
|---|---|---|---|---|
| 4,872,825 | A | * | 10/1989 | Ross ............................ 425/117 |
| 2004/0219328 | A1 | * | 11/2004 | Tasaki et al. ................. 428/65.3 |
| 2005/0048306 | A1 | * | 3/2005 | Suzuki et al. ................. 428/548 |

FOREIGN PATENT DOCUMENTS

| | | | | | |
|---|---|---|---|---|---|
| JP | 03207610 | A | * | 9/1991 | .............. B29B 15/12 |
| JP | 11-181122 | | | 7/1999 | |
| JP | 11181122 | A | * | 7/1999 | ................. C08J 5/24 |
| JP | 2001-138437 | | | 5/2001 | |
| JP | 2004-123870 | | | 4/2004 | |
| JP | 2004123870 | A | * | 4/2004 | ................. C08J 5/24 |
| JP | 2004-188709 | | | 7/2004 | |
| JP | 2005-262591 | | | 9/2005 | |
| WO | WO 2007/040125 | | | 4/2007 | |

* cited by examiner

Primary Examiner — Christopher Schatz
Assistant Examiner — Matthew Hoover
(74) *Attorney, Agent, or Firm* — Ditthavong Mori & Steiner, P.C.

(57) ABSTRACT

A method for manufacturing a laminated board, comprising: preparing a first and a second prepregs 30a, 30b with a carrier by laminating the carrier with an insulating resin layer in which a fiber cloth is embedded, and laminating the first and the second prepregs 30a, 30b with a carrier by bonding the insulating resin layer in the first prepreg 31a with a carrier and the insulating resin layer in the second prepreg 31b with a carrier directly or via an additional member under reduced pressure and heating it.

35 Claims, 15 Drawing Sheets

(a)

(b)

(c)

(a)

(b)

(a)

(b)

METHOD FOR MANUFACTURING LAMINATED BOARD, AND LAMINATED BOARD

TECHNICAL FIELD

The present invention relates to a method for manufacturing a laminated board used as a component in a printed wiring board for electronic and electric devices, and a laminated board manufactured by the method.

BACKGROUND ART

Recent requirements for reduction in a weight and a size in electronics have led to development in direct mounting and high-density mounting of semiconductor components on a printed wiring board. Resultantly, higher quality has been required for a laminated board used in a printed wiring board on which semiconductor components are mounted.

A laminated board with both sides being metalized has been conventionally prepared by attaching metal foils such as copper foils on both sides of an insulator layer formed by coating a base material layer such as a glass cloth with a thermosetting resin such as an epoxy resin or a phenol resin or on both sides of a laminate formed by laminating the above plurality of insulator layers, as an integral part. Such a laminated board with both sides being metalized is generally manufactured by multiple batch press where a long base material layer is sequentially impregnated with resins and sequentially dried to form a long prepreg; the long prepreg is cut into pieces with a given size to prepare standard-length prepregs; a given number of the standard-length prepregs are laminated; metal foils having the same size as that of the standard-length prepreg are attached on both sides of the laminate of the given number of the standard-length prepregs; and then pressed under heating a plurality of copper foils, prepregs, printed circuit boards for an inner layer, mirror plates and so on between hot platens to cure the resins.

However, in such a multiple batch press, depending on a position in a hot platen of the laminated board, heat history in each laminated board varies during laminate molding, resulting in difference in qualities such as moldability, warpage and dimensional change, which makes it difficult to supply a product with less quality variation.

Furthermore, it is necessary to press a laminated board under a high pressure of 20 to 100 $kg/cm^2$ for removing air remaining between base material layers, leading to the problem of insufficient thickness accuracy due to resin flow.

It is believed that the limit of a thickness of an insulator layer in a laminated board with both sides being metalized is 60 µm in a conventional batch press, and such a level cannot meet the needs for a thinner laminated board with both sides being metalized which is required in the industry with tendency to weight- and size-reduction; specifically, if the thickness is less than 60 µm, the base material tends to be directly in contact with the metal foils on both surfaces and reliability in insulation is reduced due to air remaining between the base material layers.

Furthermore, the multiple batch press using a prepreg requires many steps as described above, leading to a complex process and reduced productivity.

In a conventional method for preparing a prepreg, for example a method where a fiber cloth base material is immersed in a resin varnish for impregnation and dried using a common coater, streaky asperity tends to generate in a coating direction, making it difficult to ensure thickness precision.

In a method using a roll laminator, thickness precision in an insulating layer formed can be controlled, a desired insulating layer can be easily formed, and the method can be continuously conducted, resulting in an efficient method in terms of productivity. Thus, for a method using a roll laminator, the use of a prepreg exhibiting good thickness precision and impregnation property would be effective.

However, in a method using a roll laminator, a plurality of prepreg are continuously laminated, so that setting the manufacturing conditions is difficult and void generation in an insulating resin layer becomes significant. Again, when a roll laminator is used, streaky asperity tends to generate in a coating direction, making it difficult to ensure thickness precision.

To solve these problems, there has been disclosed, as a method for preparing a prepreg exhibiting good thickness precision, a method for laminating insulating resins with a carrier on both sides of a fiber cloth base material (see, for example, Patent Reference No. 1). Patent Reference No. 1 has described that a prepreg exhibiting excellent thickness precision can be prepared by a method for laminating insulating resins with a carrier on both sides of a fiber cloth base material.

Patent Reference No. 1: Japanese published unexamined application No. 2004-123870.
Patent Reference No. 2: Japanese published unexamined application No. 2001-138437.
Patent Reference No. 3: Japanese published unexamined application No. 2005-262591.

DISCLOSURE OF THE INVENTION

However, even this method cannot achieve sufficient impregnation properties of resin components to a fiber base material and may give a prepreg with remaining voids. There is, therefore, room for improvement in insulation reliability even when a laminated board is prepared using such a prepreg.

In view of the situation described above, an objective of the present invention is to provide a method for manufacturing a laminated board exhibiting excellent insulation reliability and a laminated board manufactured by the method. Another objective of the present invention is to provide a method for manufacturing a laminated board which can provide a laminated board exhibiting excellent insulation reliability when a laminate roll is used with a higher production efficiency, and a laminated board manufactured by the method.

In accordance with the present invention, there is provided a method for manufacturing a laminated board, comprising the steps of:

preparing a first and a second prepregs with a carrier by laminating the carrier with an insulating resin layer in which a fiber cloth is embedded, and laminating said first and said second prepregs with a carrier by bonding said insulating resin layer in said first prepreg with a carrier and said insulating resin layer in said second prepreg with a carrier directly or via an additional member under reduced pressure and heating it.

In the present invention, the insulating resin layer in the first prepreg with a carrier and the insulating resin layer in the second prepreg with a carrier are bonded under reduced pressure and are heated. Thus, voids can be effectively eliminated in the bonding plane between the insulating resin layers, resulting in the substantial absence of an unfilled part. A laminated board exhibiting excellent insulation reliability can be, therefore, easily manufactured.

In accordance with the present invention, there is provided a method for manufacturing a laminated board where a first and a second long-strip prepregs with a carrier are continuously laminated, comprising the steps of:

preparing a first and a second long-strip two-side prepregs with a carrier by laminating a carrier, an insulating resin layer in which a fiber cloth is embedded, and another carrier, peeling off said carrier in one side of each of said first and said second two-side prepregs with a carrier to prepare the first and the second long-strip prepregs with a carrier in which said insulating resin layer in one side is exposed, directly or via an additional member abutting said insulating resin layers in said first and said second long-strip prepregs with a carrier under reduced pressure while pressing the laminate by a pair of laminate rolls to bond said insulating resin layers together, and heating the laminate formed in the preceding step, wherein all of these steps are continuously repeated.

In the present invention, the insulating resin layer in the first prepreg with a carrier and the insulating resin layer in the second prepreg with a carrier are continuously bonded by pressing them by a pair of laminate rolls under reduced pressure with heating. Thus, voids can be effectively eliminated in a bonding plane between the insulating resin layers, resulting in the substantially absence of an unfilled part. A laminated board exhibiting excellent insulation reliability can be, therefore, easily manufactured. Furthermore, the use of a pair of laminate rolls allows for continuously producing laminates, resulting in an improved production efficiency.

As used herein, the term "carrier" refers to a metal foil or resin film.

According to the method for manufacturing a laminated board of the present invention, a laminated board exhibiting excellent insulation reliability can be easily manufactured. Furthermore, according to the method for continuously manufacturing a laminated board using laminate rolls in the present invention, a laminated board exhibiting excellent insulation reliability can be obtained with an improved production efficiency.

A laminated board of the present invention obtained by any of the above methods can be suitably used for manufacturing a multilayer printed wiring board which is required to be highly integrated and highly multilayered.

BEST MODE FOR CARRYING OUT THE INVENTION

Figure 1:
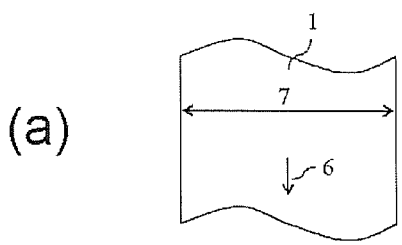
FIG. 1 is a schematic view showing positional relationship of a carrier, a carrier with an insulating resin layer and a fiber cloth used in the manufacturing method of this embodiment.
Figure 1:
Figure 1:
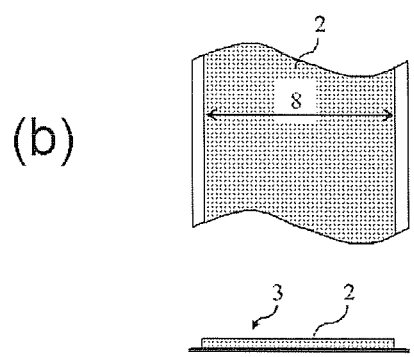
Figure 1:
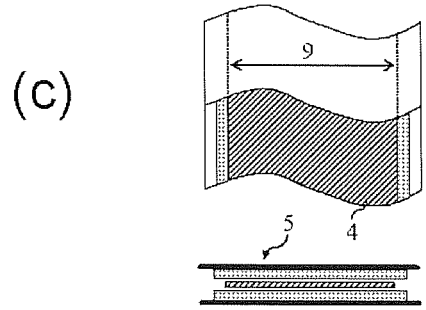

There will be detailed a method for manufacturing a laminated board using a prepreg with a carrier of this embodiment, and a laminated board with reference to the drawings. In all the drawings, equivalent elements are denoted by similar symbols, for which description will not be repeated as appropriate. The present invention will be described with reference to Embodiments A and B.

Embodiment A

A method for manufacturing a laminated board using a prepreg with a carrier according to Embodiment A has the following steps:

(1) preparing a first and a second prepregs with a carrier by laminating the carrier with an insulating resin layer in which a fiber cloth is embedded, and (2) laminating said first and said second prepregs with a carrier by bonding said insulating resin layer in said first prepreg with a carrier and said insulating resin layer in said second prepreg with a carrier directly or via an additional member under reduced pressure and heating it.

Embodiment A1

In the method for manufacturing a laminated board according to Embodiment A1, Step (1) includes the following steps (a) to (d), and Step (2) includes the following steps (e) and (f).

(a) laminating a fiber cloth with a first and a second carriers with an insulating resin layer having a carrier on one side such that the sides of the fiber cloth are attached to the insulating resin layer sides in the first and the second carriers with an insulating resin layer in which the carrier is formed in one side, respectively and bonding them under reduced pressure, (b) after the bonding, heating the laminate at a temperature of a glass transition temperature of an insulating resin component constituting the insulating resin layer or higher to prepare a two-side prepreg with a carrier, (c) repeating steps (a) and (b) to prepare a first and a second two-side prepregs with a carrier, (d) removing said carrier from one side of each of the first and the second two-side prepregs with a carrier to expose the insulating resin layer, (e) disposing the exposed insulating resin layers of the first and the second prepregs with a carrier such that the layers face each other and bonding the insulating resin layers under reduced pressure, and (f) after step (e), heating the product for laminating the first and the second prepregs with a carrier.

First, there will be described step (a).

In step (a), the sides of a fiber cloth are attached to the insulating resin layer sides in a first and a second carriers with an insulating resin layer in which the carrier is formed in one side, respectively and these are bonded under reduced pressure.

Thus, during bonding the insulating resin layer in the carrier with an insulating resin layer with the fiber cloth, unfilled parts within the fiber cloth or a bonding interface between the insulating resin layer in the carrier with an insulating resin layer, if present, can be made into low-pressure voids or substantially vacuum voids.

The step is preferably conducted under the condition of a vacuum degree of 60 Torr, more preferably a vacuum degree of 20 Torr. Thus, the above effects can be considerably achieved.

The first carrier with an insulating resin layer and the second carrier with an insulating resin layer used in step (a) may be the same or different. Here, a carrier with an insulating resin layer means a metal foil with an insulating resin layer or a resin film with an insulating resin layer.

The first carrier with an insulating resin layer and the second carrier with an insulating resin layer can be bonded with the fiber cloth, for example, by, but not limited to, bonding the fiber cloth with the carriers with an insulating resin layer while they are continuously fed and laminated.

The bonding under reduced pressure can be conducted by using, but not limited to, an appropriate apparatus such as a vacuum laminator and a vacuum box apparatus.

Among these, it is preferable that using a vacuum laminator, the fiber cloth and the carriers with an insulating resin layer are bonded while they are continuously laminated.

Thus, a continuous methoding is allowed, so that a prepreg with a carrier can be efficiently prepared by a simple apparatus.

In step (a), it is preferable that when the insulating resin layer side of the carrier with an insulating resin layer is bonded to the fiber cloth, they are heated to a temperature at which flowability of the resin components in the insulating resin layer is improved. Thus, the fiber cloth and the insulating resin layer can be easily bonded. Furthermore, at least part of the insulating resin layer is molten and impregnates the fiber cloth, to facilitate production of a prepreg with a carrier exhibiting excellent impregnation properties.

There are no particular restrictions to a heating method, and for example, laminate rolls heated at a predetermined temperature can be suitably used during bonding. A heating temperature may vary depending on the type and the composition of a resin constituting an insulating resin layer, and specifically, may be 60 to 100° C.

There will be described a carrier with an insulating resin layer used in step (a).

FIG. 1(b) illustrates a carrier 3 with an insulating resin layer used in this embodiment.

In the carrier 3 with an insulating resin layer, an insulating resin layer 2 is formed as a thin layer in one side of a carrier 1. The insulating resin layer 2 has a width-directional dimension 8, and can be formed in one side of the carrier 1 to a predetermined thickness. Here, the width-directional dimension 8 refers to a dimension of the insulating resin layer 2 in a direction perpendicular to the carrying direction of the carrier 1.

There will be described a carrier used in a carrier with an insulating resin layer.

FIG. 1(a) illustrates a carrier 1 applied to a carrier 3 with an insulating resin layer used in this embodiment.

The carrier 1 can be fed by continuously carrying it in the direction of an arrow 6, and has a width-directional dimension 7. Here, a width-directional dimension 7 refers to a dimension in a direction perpendicular to the carrying direction of the carrier 1.

A suitable example of the carrier 1 may be a long sheet.

Examples of a material for a carrier include, but not limited to, a thermoplastic resin film sheet made from a thermoplastic resin such as polyethylene terephthalate, polyethylene and a polyimide, or a metal foil made of a metal such as copper or a copper alloy, aluminum or an aluminum alloy and silver or a silver alloy.

Among these, polyethylene terephthalate is preferable as a thermoplastic resin for forming a thermoplastic resin film sheet because it is highly heat resistant and inexpensive.

As a metal for forming a metal foil, copper or a copper alloy is preferable because it is highly conductive, allows a circuit to be easily formed by etching and is inexpensive.

When a thermoplastic resin film sheet is used as the carrier, it is preferable that a surface on which an insulating resin layer is to be formed is processed to be peelable. Thus, the insulating resin layer can be easily separated from the carrier during or after production of a multilayer printed wiring board.

A thickness of this thermoplastic resin film sheet may be 25 to 75 μm. Thus, workability during preparing a carrier with an insulating resin layer may be improved.

If a thickness of the thermoplastic resin film sheet is too small, mechanical strength may be inadequate during preparing the carrier with an insulating resin layer. If the thickness is too large, there are no problems in preparing the carrier with an insulating resin layer, but productivity in preparing the carrier with an insulating resin layer may be deteriorated.

When a metal foil is used as the carrier, it may be one where a surface on which an insulating resin layer is to be formed is processed to be peelable. Alternatively, one which is not subjected to such processing may be used, and it may be processed to be more adhesive to the insulating resin layer.

When a metal foil where a surface on which the insulating resin layer is to be formed is processed to be peelable is used as the carrier, it may be effective as in the case where the thermoplastic resin film sheet is used.

A thickness of this metal foil may be 1 to 70 µm. Thus, workability during preparing a carrier with an insulating resin layer may be improved.

If a thickness of the metal foil is too small, mechanical strength may be inadequate during preparing the carrier with an insulating resin layer. If the thickness is too large, there are no problems in preparing the carrier with an insulating resin layer, but productivity may be deteriorated.

When a metal foil which is unprocessed to be peelable or is processed to be more adhesive to the insulating resin layer is used as the carrier, the metal foil as such can be used as a conductor layer for forming a circuit when preparing a multilayer printed wiring board.

The carrier surface in the side in which the insulating resin layer is to be formed may have irregularity of, for example, Ra: 0.1 to 0.5 µm. Thus, adhesiveness between the insulating layer and the metal foil ca be adequately ensured, and by processing this metal foil by, for example, etching, a fine circuit may be easily processed/formed.

The metal foil may preferably have a thickness of 1 to 35 µm. If the metal foil has a too small thickness, mechanical strength may be inadequate during preparing a carrier with an insulating resin layer. If the thickness is too large, it may become difficult to process/form a fine circuit. In other words, a thickness of the metal foil within the above range allows both mechanical strength and processing properties to be satisfactory.

When two prepregs with a carrier are used for manufacturing a laminated board, this metal foil can be used as a carrier in one of the prepregs with a carrier. When three or more prepregs with a carrier are used for manufacturing a laminated board, this metal foil cannot be used in a prepreg with a carrier sandwiched by two prepregs with a carrier as the outermost layers in the laminated board. In such a case, when the metal foil is peeling-processed, it may be used.

A metal foil used in such an application may be a metal foil formed from one layer or a metal foil consisting of two or more metal foil layers which are peelable from each other. For example, a two-layer structure metal foil may be used, in which a first metal foil in the side where an insulating resin layer is to be bonded is bonded to a second metal foil capable of supporting the first metal foil in the opposite side to the side where the insulating layer is to be bonded.

There will be described insulating resin materials for forming the insulating resin layer in the carrier with an insulating resin layer.

Examples of insulating resin materials suitably used for forming an insulating resin layer include, but not limited to, thermosetting resins such as epoxy resins, phenol resins, cyanate resins, unsaturated polyester resins, dicyclopentadiene resins and bismaleimide triazine resins. In addition, it may contain, if needed, additives such as a curing agent, a curing accelerator, a thermoplastic resin, an inorganic filler, an organic filler and a coupling agent as appropriate.

An insulating resin used in this embodiment may be suitably used as a liquid in which the above components are dissolved and/or dispersed in, for example, an organic solvent.

There will be described the carrier with an insulating resin layer.

A carrier with an insulating resin layer used in the present invention has an insulating resin layer made from the insulating resin material on one side of the carrier. The layer can be formed by, but not limited to, applying a liquid insulating resin a carrier using any of various coaters such as a comma coater and a knife coater, or applying a liquid insulating resin on a carrier using any of various spraying devices such as a spray nozzle.

Among these, it is preferable to apply a liquid insulating resin on a carrier using any of various coaters. Thus, a convenient apparatus can be used to form an insulating resin layer with excellent thickness precision.

When preparing a carrier with an insulating resin layer, a liquid insulating resin can be applied on a carrier, which can be, if necessary, then dried at an ambient temperature or under heating.

Thus, when an organic solvent or dispersion medium is used for preparing a liquid insulating resin, it can be substantially removed to make the surface of the insulating resin layer non-tacky, giving a carrier with an insulating resin layer with excellent handling properties.

Alternatively, after partly curing the insulating resin, fluidity of the insulating resin in step (a) or step (b) described below can be adjusted.

There are no particular restrictions to the drying method under heating as described above; for example, continuous processing using a hot air oven or infrared heater may be suitably applied.

In a carrier with an insulating resin layer used in this embodiment, a thickness of the insulating resin layer may be appropriately selected, depending on a thickness of a fiber cloth used, and may be 5 to 100 µm.

This insulating resin layer may be formed by applying the same insulating resin once or more, or applying different insulating resins twice or more.

After thus forming a carrier with an insulating resin layer, a protecting film can be laminated on the upper surface of the insulating resin layer formed, that is, the opposite side to that having a carrier for protecting the surface of the insulating resin layer.

There will be described a style for laminating a carrier with an insulating resin layer and a fiber cloth.

FIG. 1(c) shows an example of style 5 for laminating a carrier 3 with an insulating resin layer and a fiber cloth 4.

The fiber cloth 4 can be continuously fed/carried in the same direction as the carrying direction of a carrier 1 and has a width-directional dimension 9. Here, the width-directional dimension 9 refers to a dimension of the fiber cloth 4 in a direction perpendicular to a feeding direction in the fiber cloth 4. Such a fiber cloth 4 may be, for example, suitably a long sheet.

Examples of a material for the fiber cloth include, but not limited to, fiber cloths such as woven glass fabric and unwoven glass fabric; inorganic fiber cloths such as woven and unwoven fabrics containing an inorganic compound other than glass as a component; and organic fiber cloths such as aromatic polyamide resins, polyamide resins, aromatic polyester resins, polyester resins, polyimide resins and fluororesins.

Among these, a glass fabric which is a glass fiber cloth, can be used to improve mechanical strength and heat resistance of a multilayer printed wiring board.

When a glass fabric as the fiber cloth is used, it may have a thickness of 15 to 180 µm. Its grammage (a weight of a fiber cloth per 1 $m^2$) may be, for example, 17 to 209 $g/m^2$.

In a manufacturing method of this embodiment, particularly, a thin glass fabric with a thickness of 15 to 35 μm and a grammage of 17 to 25 g/cm² can be used. Even when such a glass fabric is used, a laminated board having a prepreg with a carrier exhibiting excellent mechanical properties and impregnating properties can be obtained because fiber bundles constituting the fiber cloth is resistant to bending.

A conventional method for manufacturing a prepreg, for example, a method where a fiber cloth is immersed in a resin varnish for impregnation and then dried using a common applicator. This method has a problem that during passing it through a number of carrying rolls or adjusting the amount of the insulating resin impregnated in the fiber cloth, the fiber cloth tends to be subjected to stress.

The effect is prominent particularly when a thin glass fabric is used; specifically, tendency to bending of the fiber bundles or expansion of an opening between warps and woofs. A laminated board having such a prepreg has internal strain, which may cause warpage of a multilayer printed wiring board and affect its mechanical properties such as dimensional stability.

A conventional method for manufacturing a prepreg, for example, a method where a fiber cloth is immersed in a resin varnish for impregnation and then dried using a common applicator, and this drying process is conducted while a uncured resin varnish remains as a coating on the surface of the fiber cloth. Thus, a viscosity of the resin varnish is reduced in a drying furnace, causing dripping and surface unevenness due to hot air, which lead to unsatisfactory thickness precision.

In a method for preparing a laminated board using this prepreg by batch press, a thickness can be made within a desired range by high-pressure molding, but curing under high pressure causes internal residual strain. It leads to warpage of a multilayer printed wiring board and affects mechanical properties such as dimensional stability.

On the other hand, in a low-pressure molding in which internal strain is prevented, resin flow under vacuum is insufficient to remove residual voids in the prepreg and a laminated board having residual voids is often provided, and when such a prepreg is used for manufacturing a laminated board, insulation reliability is deteriorated.

In contrast, in a method for manufacturing a laminated board having a prepreg with a carrier of this embodiment, a fiber cloth is not substantially subjected to a stress irrespective of a thickness or grammage of a fiber cloth or the number and the total thickness of laminated layers, so that fiber bundles are resistant to bending and a laminated board exhibiting excellent impregnation properties and improved thickness precision can be prepared.

There will be described step (b).

step (b) includes heating the laminate after the bonding in step (a) at a temperature of a glass transition temperature of an insulating resin component constituting the insulating resin layer or higher to prepare a two-side prepreg with a carrier.

Thus, low-pressure voids or substantially vacuum voids remaining after laminating the carriers with an insulating resin layer with the fiber cloth in step (a) can be eliminated to provide a prepreg with a carrier having a very few unfilled parts or substantially free from an unfilled part.

The heating may be conducted, for example, using an apparatus including, but not limited to, a hot air oven, an infrared heater, a heating roller and a flat hot-platen press.

When a hot air oven or infrared heater is used, heating can be conducted substantially without applying a pressure to the laminate.

When a heating roller or flat hot-platen press is used, heating can be conducted with applying a predetermined pressure to the laminate.

Among these, heating is preferably conducted substantially without applying a pressure to the laminate.

According to this method, the resin components do not excessively flow in step (b), so that a prepreg with a carrier having a desirable and highly even insulating-layer thickness can be efficiently prepared.

As the resin components flow, a stress to the fiber cloth base material can be minimized, resulting in a very small internal strain.

Furthermore, a pressure is not substantially applied when the resin components are molten, so that defective dents can be substantially eliminate in this step.

A temperature during the heating may be a glass transition temperature or higher, at which an insulating resin become flowable while a curing reaction of the insulating resin does not rapidly proceed.

There are no particular restrictions to a heating time which depends on factors such as the type of an insulating resin used; for example, the heating can be conducted for 1 to 10 min.

There will be described a two-side prepreg with a carrier provided in step (b) with reference to the configurations illustrated in FIGS. 2(a) to (c), 3(a) to (c) and 4(a) to (c).

First, the configurations illustrated in FIGS. 2(a) to (c) will be described.

Figure 2:
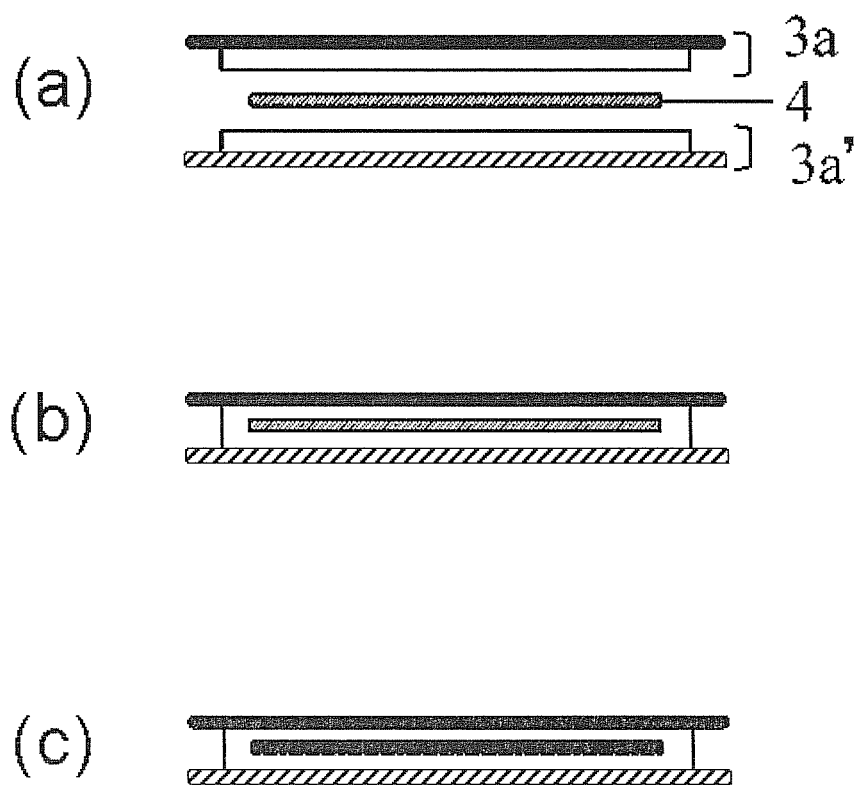
FIG. 2 is a schematic cross-sectional process chart illustrating an example of manufacturing a prepreg with a carrier used in the manufacturing method of this embodiment.

In FIG. 2(a) to (c), the first carrier 3a' with an insulating resin layer and the second carrier 3a with an insulating resin layer have a carrier having a width-directional dimension larger than that of the fiber cloth 4 and an insulating resin layer having a width-directional dimension larger than that of the fiber cloth 4. Here, FIG. 2(a) shows relation in a width-directional dimension for each of a carrier, an insulating resin layer and a fiber cloth.

The carrier in the first carrier 3a' with an insulating resin layer is peelable from the insulating resin layer. This carrier may be a film sheet or metal foil in which the side on which the insulating resin layer is to be formed is processed to be peelable. On the other hand, the carrier in the second carrier 3a with an insulating resin layer is tightly attached to the insulating resin layer. This carrier may be a metal foil processed to be more adhesive to the insulating resin layer.

In this configuration, in step (a), the insulating resin layer of the first carrier 3a' with an insulating resin layer and the fiber cloth 4, and the insulating resin layer of the second carrier 3a with an insulating resin layer and the fiber cloth 4, respectively, may be laminated in the inner region of the carrier with an insulating resin layer in a width-directional dimension, that is, a region where the fiber cloth 4 is present in the width direction.

In the outer region of the fiber cloth 4 in the width-directional dimension, that is, a region where the fiber cloth is absent, the insulating resin layer surface in the first carrier 3a' with an insulating resin layer and the insulating resin layer surface in the second carrier 3a with an insulating resin layer can be directly bonded and the fiber cloth 4 can be sealed by the insulating resin layer. The status is illustrated in FIG. 2(b).

Furthermore, since these bonding are conducted under a reduced pressure, remaining unfilled parts, if present, within the fiber cloth 4 or the bonded surface between the insulating resin layers of the first and the second carriers 3a', 3a with an insulating resin layer and the fiber cloth 4 can be made low-pressure voids or substantially vacuum voids, so that in step (b), heating at a temperature equal to or higher than the glass transition temperature of the resin can easily eliminate them.

Furthermore, in step (b), new void formation due to the air entering from the periphery in the width direction can be prevented. The status is illustrated in FIG. 2(c).

Next, the configurations illustrated in FIGS. 3(a) to (c) will be described.

Figure 3:
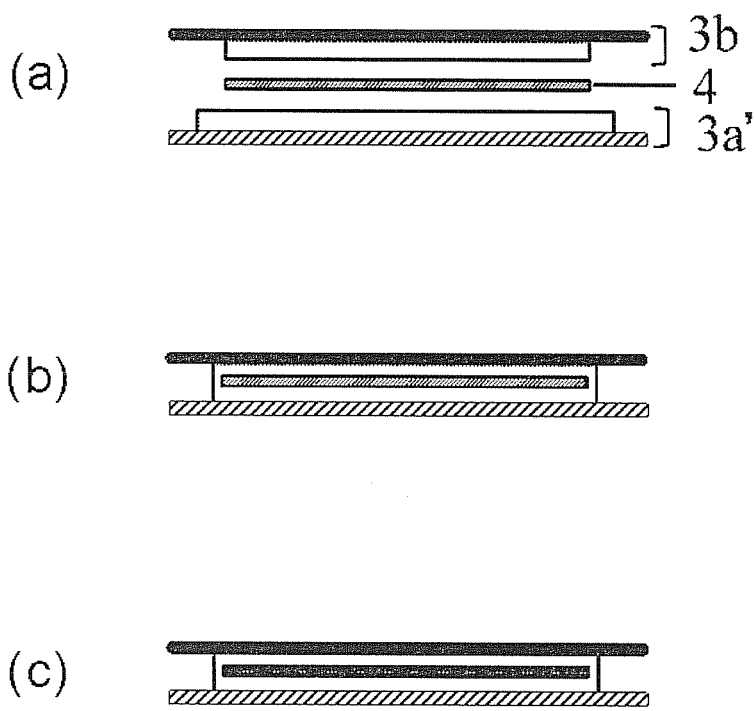
FIG. 3 is a schematic cross-sectional process chart illustrating an example of manufacturing a prepreg with a carrier used in the manufacturing method of this embodiment.

In FIG. 3(a) to (c), for example, the first carrier 3a' with an insulating resin layer has an insulating resin layer having a width-directional dimension larger than that of the fiber cloth 4, and the second carrier 3b with an insulating resin layer has an insulating resin layer having a width-directional dimension equal to that of the fiber cloth 4. Here, FIG. 3(a) shows relation in a width-directional dimension for each of a carrier, an insulating resin layer and a fiber cloth.

The carrier in the first carrier 3a' with an insulating resin layer is peelable from the insulating resin layer. This carrier may be a film sheet or metal foil in which the side on which the insulating resin layer is to be formed is processed to be peelable. On the other hand, the carrier in the second carrier 3b with an insulating resin layer is tightly attached to the insulating resin layer. This carrier may be a metal foil processed to be more adhesive to the insulating resin layer.

In this configuration, in step (a), the insulating resin layer of the first carrier 3a' with an insulating resin layer and the fiber cloth 4, and the insulating resin layer of the second carrier 3b with an insulating resin layer and the fiber cloth 4, respectively, may be laminated in the inner region of the first and the second carriers 3a',3b with an insulating resin layer in a width-directional dimension, that is, a region where the fiber cloth 4 is present.

In the outer region of the fiber cloth 4 in the width-directional dimension, that is, a region where the fiber cloth is absent, the insulating resin layer surface in the first carrier 3a' with an insulating resin layer and the carrier surface in the second carrier 3b with an insulating resin layer can be directly bonded. The status is illustrated in FIG. 3(b).

Furthermore, since these bonding are conducted under a reduced pressure, remaining unfilled parts, if present, within the fiber cloth 4 or the bonded surface between the insulating resin layer of the first and the second carriers 3a', 3b with an insulating resin layer and the fiber cloth 4 can be made low-pressure voids or substantially vacuum voids, so that in step (b), heating at a temperature equal to or higher than the glass transition temperature of the resin can easily eliminate them. Furthermore, in step (b), new void formation due to the air entering from the periphery in the width direction can be prevented. The status is illustrated in FIG. 3(c).

Next, the configurations illustrated in FIGS. 4(a) to (c) will be described.

Figure 4:
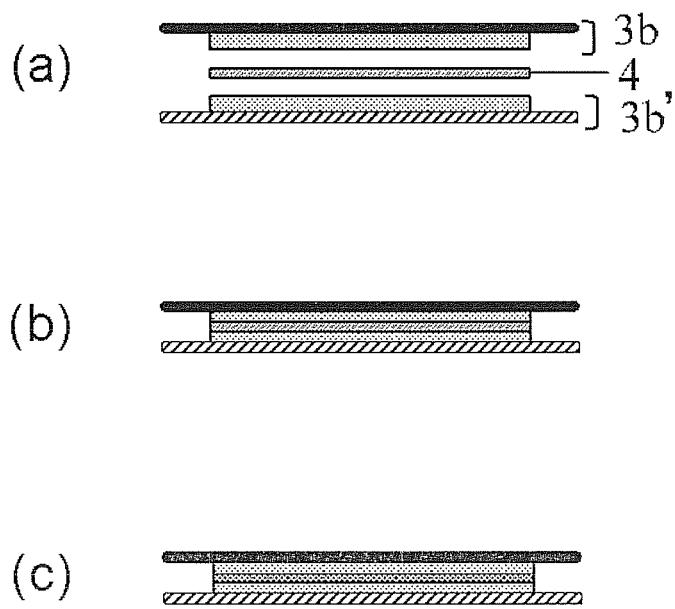
FIG. 4 is a schematic cross-sectional process chart illustrating an example of manufacturing a prepreg with a carrier used in the manufacturing method of this embodiment.

In FIG. 4(a) to (c), the first and the second carriers 3b', 3b with an insulating resin layer have an insulating resin layer having a width-directional dimension equal to that of the fiber cloth 4. Here, FIG. 4(a) shows relation in a width-directional dimension for each of a carrier, an insulating resin layer and a fiber cloth.

The carrier in the first carrier 3b' with an insulating resin layer is peelable from the insulating resin layer. This carrier may be a film sheet or metal foil in which the side on which the insulating resin layer is to be formed is processed to be peelable. On the other hand, the carrier in the second carrier 3b with an insulating resin layer is tightly attached to the insulating resin layer. This carrier may be a metal foil processed to be more adhesive to the insulating resin layer.

In this configuration, in step (a), the insulating resin layer of the first carrier 3b' with an insulating resin layer and the fiber cloth 4, and the insulating resin layer of the second carrier 3b with an insulating resin layer and the fiber cloth 4, respectively, may be laminated in the inner region of the carrier with an insulating resin layer in a width-directional dimension, that is, a region where the fiber cloth 4 is present. The status is illustrated in FIG. 4(b).

In this configuration, it is preferable that after step (a), that is, after the first and the second carriers 3b', 3b with an insulating resin layer are laminated with the fiber cloth 4, unfilled parts present in the end in a width direction are not communicated with unfilled parts present in an area other than the end in the width direction.

Thus, the unfilled parts present in the area other than the end in the width direction can be made low-pressure voids or substantially vacuum voids because step (a) is conducted under a reduced pressure, and these can be easily eliminated by heating at a temperature equal to or higher than the glass transition temperature of the resin in step (b). In step (b), new void formation due to the air entering from the periphery in the width direction can be restricted to the end in the width direction. This status is illustrated in FIG. 4(c).

There will be described step (c).

In this step (c), steps (a) and (b) are repeated to prepare a couple of two-side prepregs with a carrier. In this embodiment, an additional step may be, in addition to steps (a) and (b), included.

It is preferable in this embodiment to adjust a thickness of the laminated board to 30 μm or more and 200 μm or less in the light of productivity. Thus, a two-side prepreg with a carrier may be prepared such that a thickness of the laminated board is within the above range; for example, two or more and four or less two-side prepregs with a carrier may be used. This embodiment will be described for an example where a couple of two-side prepregs with a carrier are used.

There will be described step (d).

Figure 5:
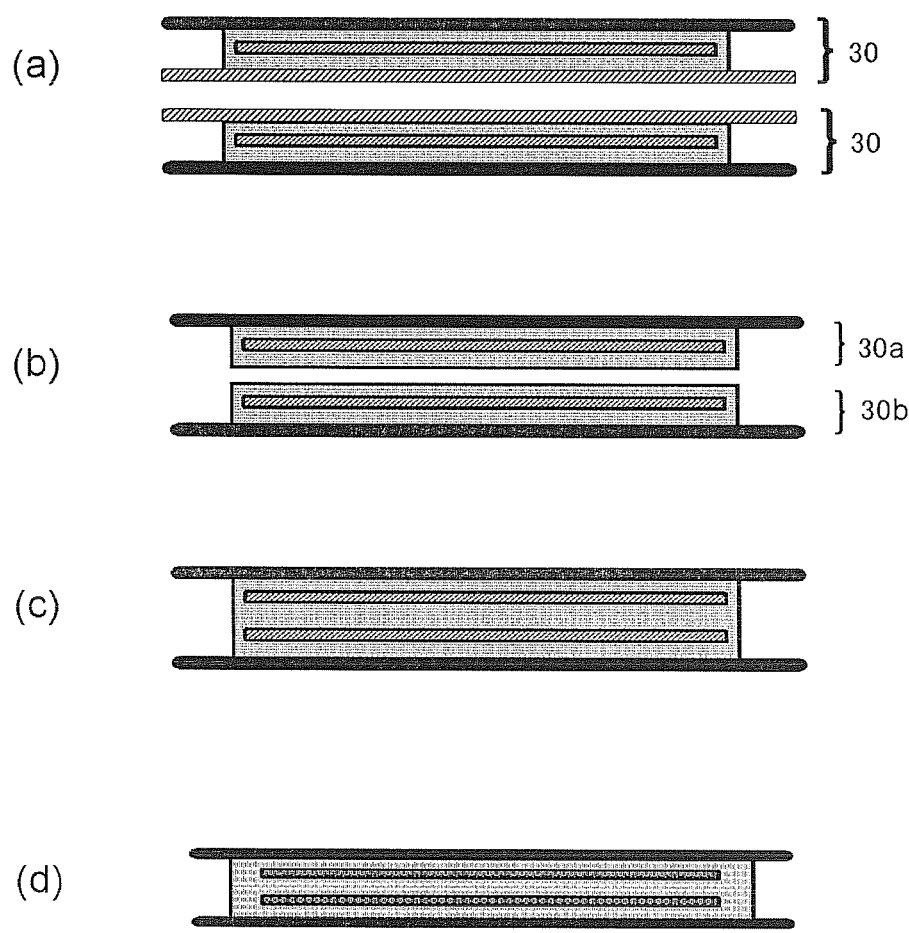
FIG. 5 is a schematic cross-sectional process chart illustrating an example of manufacturing a laminated board using two prepregs with a carrier in the manufacturing method of this embodiment.

In step (d), a carrier in one side is removed in the first and the second two-side prepregs 30,30 with a carrier obtained in the previous step to give the first and the second prepregs with a carrier 30a, 30b in which an insulating resin surface is exposed, as shown in FIGS. 5(a) and (b) (or FIGS. 6(a) and (b)).

The carrier in the prepreg with a carrier can be removed by, but not limited to, continuously feeding the two-side prepregs with a carrier while a carrier in one side in each of the two-side prepregs with a carrier is continuously wound.

There will be described step (e).

In this step (e), the above exposed insulating resin layers in the first and the second prepregs 30a, 30b with a carrier face each other in such a manner that the carriers are the outermost layers, and the insulating resin layers are directly bonded under reduced pressure, as shown in FIGS. 5(b) and (c) (or FIGS. 6(b) and (c)).

Thus, even when there is a space in a bonding interface between the laminated insulating resin layers during bonding of the prepregs with a carrier, the space can be made into a low-pressure or substantially vacuum void.

In terms of the vacuum conditions, a vacuum degree is 20 Torr or less, preferably 10 Torr or less. Thus, the above effects can be substantially achieved. There are no particular restrictions to the lower limit, and 1 Torr or more may be acceptable in the light of the above effects.

The prepregs with a carrier prepared by the method as described above are used and laminated under the vacuum conditions as described above, so that a laminated board exhibiting excellent thickness precision can be obtained.

Two prepregs with a carrier may be bonded by continuously feeding two prepregs with a carrier in which a carrier in one side is removed while the insulating resin layers are laminated.

There are no particular restrictions to a method for bonding under reduced pressure, and for example, a vacuum laminator or vacuum box apparatus may be used.

Among these, it is preferable that using a vacuum laminator, the first and the second prepregs with a carrier in which the carrier in one side is removed are continuously laminated while being bonded. This allows for continuous processing and for efficient production of a laminated board using prepregs with a carrier by a simple apparatus.

In step (e), the prepregs with a carrier in which the carrier is removed are preferably heated at a predetermined temperature while being bonded. Thus, the insulating resin layer sides of the prepregs with a carrier in which the carrier is removed can be easily bonded. Furthermore, the insulating resin layer is at least partly molten during bonding, which facilitates production of a laminated board with reduced interlayer voids.

There are no particular restrictions to a heating method, and for example, a method employing a laminate roll heated to a predetermined temperature can be suitably used.

There are no particular restrictions to a heating temperature, which varies depending on the type and the composition of a resin forming the insulating resin layer, and it may be 60° C. or higher and 100° C. or less.

There will be described step (f).

In this step (f), as shown in FIG. 5(d) (or FIG. 6(d)), the laminate obtained in step (e) is heated to provide a laminated board.

This step can eliminate most of low-pressure voids or substantially vacuum voids remaining after bonding of the first and the second prepreg with a carrier in step (e), to provide a laminated board having few or substantially no unfilled parts. Thus, a laminated board exhibiting excellent insulation reliability can be obtained.

During the heating, substantially no pressure is applied to the bonding product of the first and the second prepregs with a carrier.

Thus, unevenness of the resin is avoided, giving a laminated board with excellent thickness precision.

It is believed that the limit of a thickness of an insulating resin layer in a laminated board with both sides being metalized is 60 μm in a conventional batch press, and such a level cannot meet the recent needs for a thinner laminated board with both sides being metalized. If the thickness of an insulator layer is less than 60 μm in batch press, the base material tends to be directly in contact with the metal foils on both surfaces and reliability in insulation is reduced.

In contrast, according to the method of this embodiment, a laminated board exhibits good thickness precision even when a laminated board with a thickness of less than 60 μm is prepared, resulting in improvement in insulation reliability and in a product yield.

The heating may be conducted, for example, using an apparatus including, but not limited to, a hot air oven, an infrared heater, a heating roller and a flat hot-platen press.

When a hot air oven or infrared heater is used, heating can be conducted substantially without applying a pressure to the laminate.

When a heating roller or flat hot-platen press is used, heating can be conducted with applying a predetermined pressure to the laminate.

Among these, heating is preferably conducted substantially without applying a pressure to the laminate.

According to this method, the resin components do not excessively flow in step (f), so that a laminated board having a desirable and highly even insulating-layer thickness can be efficiently prepared.

As the resin components flow, a stress to the fiber cloth base material can be minimized, resulting in a very small internal strain.

Furthermore, a pressure is not substantially applied when the resin components are heated, so that defective dents can be substantially eliminate in this step.

In this embodiment, it is preferable that the laminated prepared in step (e) is carried out under an ambient pressure and is heated continuously under an ambient pressure. Thus, spaces in a glass cloth are filled with a molten resin and then the product is molded under atmospheric pressure, so that while void formation is effectively prevented, a laminate exhibiting further excellent insulation reliability can be manufactured.

A heating temperature may be 60° C. or more and 200° C. or less, preferably 150° C. or more and 200° C. or less. Thus, flowability of an insulating resin is improved and a curing reaction of the insulating resin adequately proceeds, so that void formation can be more effectively prevented.

There are no particular restrictions to heating time which may vary depending on, for example, the type of an insulating resin used; for example, 10 to 20 min.

According to the method for manufacturing a laminated board of this embodiment consisting of steps (a) to (f) as described above, a laminated board is manufactured using a prepregs with a carrier exhibiting excellent impregnation properties and thickness precision under the predetermined conditions, so that a laminated board exhibiting excellent insulation reliability can be easily provided. Furthermore, after bonding of the first and the second prepregs with a carrier, the resultant laminated can be heated with applying substantially no pressure. Thus, there can be efficiently manufactured a prepreg with a carrier having a desired thickness of an insulating layer and good thickness precision in the sense of higher evenness in an insulating layer thickness.

A laminated board prepared by the manufacturing method of this embodiment can be suitably used for manufacturing a multilayer printed wiring board which is required to be highly integrated and highly multilayered.

There will be described the method for manufacturing a laminated board in this embodiment with reference to FIGS. 5(a) to (d) and FIGS. 6(a) to (d).

In FIGS. 5(a) to (d), a width-directional dimension of a fiber cloth in a first two-side prepreg 30 with a carrier and a second two-side prepreg 30 with a carrier is smaller than a width-directional dimension of an insulating resin layer. FIG. 5(a) shows relationship in a width-directional dimension for the first and the second two-side prepregs 30,30 with a carrier. As shown in FIG. 5(b), in the first prepreg 30a with a carrier and the second prepreg 30b with a carrier, the carrier in one side is removed and they are disposed such that the exposed insulating resin layers face each other.

In this configuration, in step (e), the insulating resin layer of the first prepreg 30a with a carrier and the insulating resin layer of the second prepreg 30b with a carrier, respectively, may be laminated in the inner region of the first and the second prepregs with a carrier in a width direction, that is, a region where the fiber cloth 4 is present in the width direction.

In the outer region of the prepregs with a carrier in the width-directional dimension, that is, a region where the fiber cloth 4 is absent, the insulating resin layer surface in the first prepreg 30a with a carrier and the insulating resin layer surface in the second prepreg 30b with a carrier can be directly bonded. The status is illustrated in FIG. 5(c).

Furthermore, since these bonding are conducted under a reduced pressure, remaining unfilled parts, if present, within the bonded surface between the insulating resin layers of the first and the second prepregs 30a, 30b with a carrier can be made low-pressure voids or substantially vacuum voids, so that in step (f), heating at a predetermined temperature can easily eliminate them. Furthermore, in step (f), new void formation due to the air entering from the periphery in the width direction can be prevented. The status is illustrated in FIG. 5(d).

There will be described the configuration illustrated in FIGS. 6(a) to (d).

Figure 6:
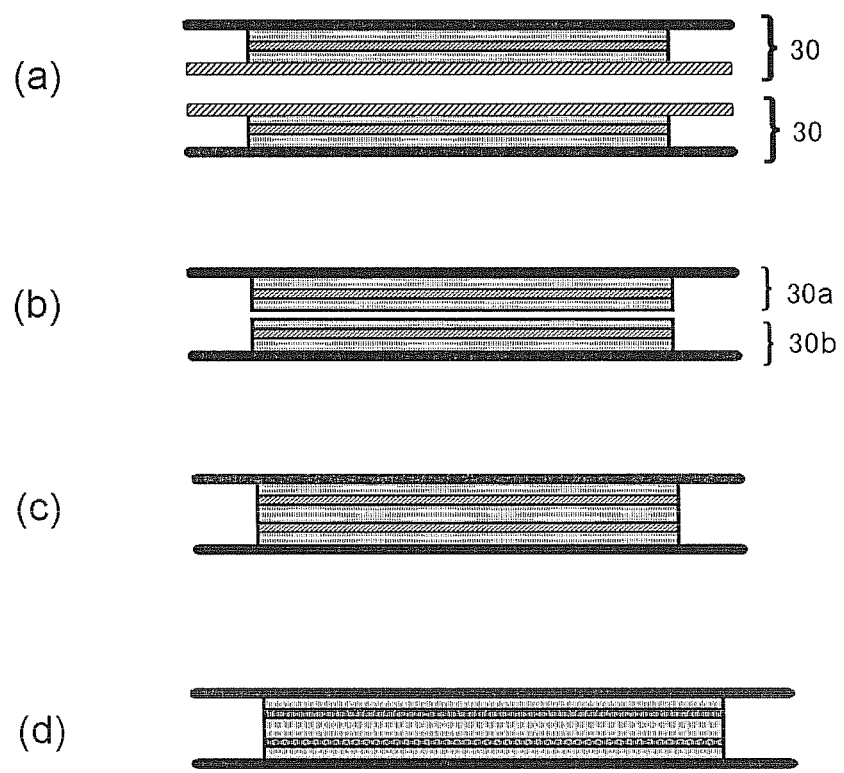
FIG. 6 is a schematic cross-sectional process chart illustrating an example of manufacturing a laminated board using two prepregs with a carrier in the manufacturing method of this embodiment.

In FIG. 6, a width-directional dimension of an insulating resin layer in a first two-side prepreg 30 with a carrier and a second two-side prepreg 30 with a carrier is equal to a width-directional dimension of a fiber cloth 4. FIG. 6(a) shows relationship in a width-directional dimension for each of the carrier, the insulating resin layer and the fiber cloth. As shown in FIG. 6(b), in the first prepreg 30a with a carrier and the second prepreg 30b with a carrier, the carrier in one side is removed and they are disposed such that the exposed insulating resin layers face each other.

In this configuration, in step (e), the insulating resin layer of the first prepreg 30a with a carrier and the insulating resin layer of the second prepreg 30b with a carrier, respectively, may be laminated in the inner region of the first and the second prepregs 30a, 30b with a carrier in a width-directional dimension, that is, a region where the fiber cloth 4 is present. This status is shown in FIG. 6(c).

In this configuration, it is preferable that after step (e), that is, after the first and the second prepregs with a carrier are laminated, unfilled parts present in the end in a width direction are not communicated with unfilled parts present in an area other than the end in the width direction.

Thus, the unfilled parts present in the area other than the end in the width direction can be made low-pressure voids or substantially vacuum voids because steps (a) and (e) are conducted under a reduced pressure, and these can be easily eliminated by heating at a temperature within a predetermined temperature range in step (f). In step (f), new void formation due to the air entering from the periphery in the width direction can be restricted to the end in the width direction. This status is illustrated in FIG. 6(d).

Embodiment A2

In the method for manufacturing a laminated board according to Embodiment A2, Step (1) includes the following steps (a) to (d), and Step (2) includes the following steps (e) and (f).

(a) laminating a fiber cloth with a first and a second carriers with an insulating resin layer having a carrier on one side such that the sides of the fiber cloth are attached to the insulating resin layer sides in the first and the second carriers with an insulating resin layer in which the carrier is formed in one side, respectively and bonding them under reduced pressure, (b) after the bonding, heating the laminate at a temperature of a glass transition temperature of an insulating resin component constituting the insulating resin layer or higher to prepare a two-side prepreg with a carrier, (c) repeating steps (a) and (b) to prepare a first and a second two-side prepregs with a carrier, and to prepare a third two-side prepreg with a carrier, (d) removing said carrier from one side of each of the first and the second two-side prepregs with a carrier to expose the insulating resin layer, and the carriers in both sides of the third two-side prepreg with a carrier are removed to prepare a film-shaped insulating resin member in which the insulating resin layer is exposed in both sides, (e) disposing the insulating resin layer of the first prepreg with a carrier and one side of the film-shaped insulating resin member as well as the insulating resin layer of the second prepreg with a carrier and the other side of the film-shaped insulating resin member such that these combinations face each other, and bonding the insulating resin layers under reduced pressure, and (f) after step (e), heating the product for laminating the first prepreg with a carrier, the film-shaped insulating resin member and the second prepreg with a carrier in sequence.

In this embodiment, the same steps as those in Embodiment A1 will not be repeated as appropriate. In the following steps, procedures conducted as described in Embodiment A1 will not repeated as appropriate.

In step (d) of this embodiment, as shown in FIGS. 7(a) and (b) (FIGS. 8(a) and (b)), the carrier is removed from one side of each of the first and the second two-side prepregs 31,31 with a carrier to expose the insulating resin layer, giving the first and the second prepregs 31a,31c with a carrier. Furthermore, the carriers in both sides of the third two-side prepreg 31' with a carrier are removed to prepare a film-shaped insulating resin member 31b in which the insulating resin layer is exposed in both sides.

The carrier in the two-side prepreg with a carrier can be removed by, but not limited to, continuously feeding the two-side prepregs with a carrier while a carrier in one side or both sides in each of the two-side prepregs with a carrier is continuously wound.

In step (e), as shown in FIGS. 7(b) and (c) (FIGS. 8(b) and (c)), the insulating resin layer of the first prepreg 31a with a carrier and one side of the film-shaped insulating resin member 31b as well as the insulating resin layer of the second prepreg 31c with a carrier and the other side of the film-shaped insulating resin member 31b are disposed such that these combinations face each other, and the insulating resin layers are bonded under reduced pressure.

A bonding method using three two-side prepregs with a carrier specifically involves removing the carrier in one side in a couple of two-side prepregs with a carrier to be the outermost layers and removing the carriers in both sides in the prepreg with a carrier sandwiched by these two prepregs with a carrier. The insulating resin layers are bonded by continuously feeding the prepreg 31a with a carrier, the film-shaped insulating resin member 31b and the prepreg 31c with a carrier thus prepared while the insulating resin layers are laminated such that the outermost layers are carriers.

There will be described step (f).

In step (f), as shown in FIGS. 7(c) and (d) (FIGS. 8(c) and (d)), the laminate obtained in step (e) is heated for laminating the first prepreg 31a with a carrier, the film-shaped insulating resin member 31b and the second prepreg 31c with a carrier such that the outermost layers are carriers.

This step can eliminate most of low-pressure voids or substantially vacuum voids remaining in the interface between the insulating resin layers in step (e), to provide a laminated board having few or substantially no unfilled parts. Thus, a laminated board exhibiting excellent insulation reliability can be obtained.

During the heating, substantially no pressure is applied to the laminate of the first prepreg 31a with a carrier, the film-shaped insulating resin member 31b and the second prepreg 31c with a carrier.

Thus, unevenness of the resin is avoided, giving a laminated board with excellent thickness precision. Insulation reliability and a product yield are, therefore, improved.

In this embodiment, it is preferable that the laminated prepared in step (e) is carried out under an ambient pressure and is heated continuously under an ambient pressure. Thus, spaces in a glass cloth are filled with a molten resin and then the product is molded under atmospheric pressure, so that while void formation is effectively prevented, a laminate exhibiting further excellent insulation reliability can be manufactured.

A heating temperature may be 60° C. or more and 200° C. or less, preferably 150° C. or more and 200° C. or less. Thus, flowability of an insulating resin is improved and a curing reaction of the insulating resin adequately proceeds, so that void formation can be more effectively prevented.

There are no particular restrictions to heating time which may vary depending on, for example, the type of an insulating resin used; for example, 10 to 20 min.

A method for manufacturing a laminated board in this embodiment will be further described with reference to FIGS. 7(a) to (d) and FIGS. 8(a) to (d).

In FIGS. 7(a) to (d), a width-directional dimension of a fiber cloth in the first two-side prepreg 31 with a carrier, the third two-side prepreg 31' with a carrier and the second prepreg 31 with a carrier is smaller than a width-directional dimension of an insulating resin layer. As shown in FIG. 7(b), in the first prepreg 31 with a carrier and the second two-side prepreg 31 with a carrier, the carrier in one side is removed, to form the first prepreg 31a with a carrier and the second prepreg 31c with a carrier in which the insulating resin layer is exposed. In the third two-side prepreg 31' with a carrier, the carriers in both sides are removed and thus the insulating resin layer is exposed to form a film-shaped insulating resin member 31b. These insulating resin layers are disposed such that they face each other. FIG. 7(a) shows relationship in a width-directional dimension for the first, the second and the third two-side prepregs with a carrier.

In this configuration, in step (e), the insulating resin layers facing each other can be bonded. This status is shown in FIG. 7(c).

Furthermore, since these bonding are conducted under a reduced pressure, remaining unfilled parts, if present, within the bonded surface between the insulating resin layers can be made low-pressure voids or substantially vacuum voids, so that in step (f), heating at a predetermined temperature can easily eliminate them. Furthermore, in step (f), new void formation due to the air entering from the periphery in the width direction can be prevented. The status is illustrated in FIG. 7(d).

There will be described the configuration illustrated in FIGS. 8(a) to (d).

In FIGS. 8(a) to (d), a width-directional dimension of a fiber cloth in the first two-side prepreg 31 with a carrier, the third two-side prepreg 31' with a carrier and the second prepreg 31 with a carrier is equal to a width-directional dimension of an insulating resin layer. As shown in FIG. 8(b), in the first two-side prepreg 31 with a carrier and the second two-side prepreg 31 with a carrier, the carrier in one side is removed, to form the first prepreg 31a with a carrier and the second prepreg 31c with a carrier in which the insulating resin layer is exposed. In the third two-side prepreg 31' with a carrier, the carriers in both sides are removed and thus the insulating resin layer is exposed to form a film-shaped insulating resin member 31b. These insulating resin layers are disposed such that they face each other. FIG. 8(a) shows relationship in a width-directional dimension for the first, the second and the third two-side prepregs with a carrier.

In this configuration, in step (e), the insulating resin layers facing each other can be bonded. This status is shown in FIG. 8(c).

Furthermore, since these bonding are conducted under a reduced pressure, remaining unfilled parts, if present, within the bonded surface between the insulating resin layers can be made low-pressure voids or substantially vacuum voids, so that in step (f), heating at a predetermined temperature can easily eliminate them. Furthermore, in step (f), new void formation due to the air entering from the periphery in the width direction can be prevented. The status is illustrated in FIG. 8(d).

Figure 7:
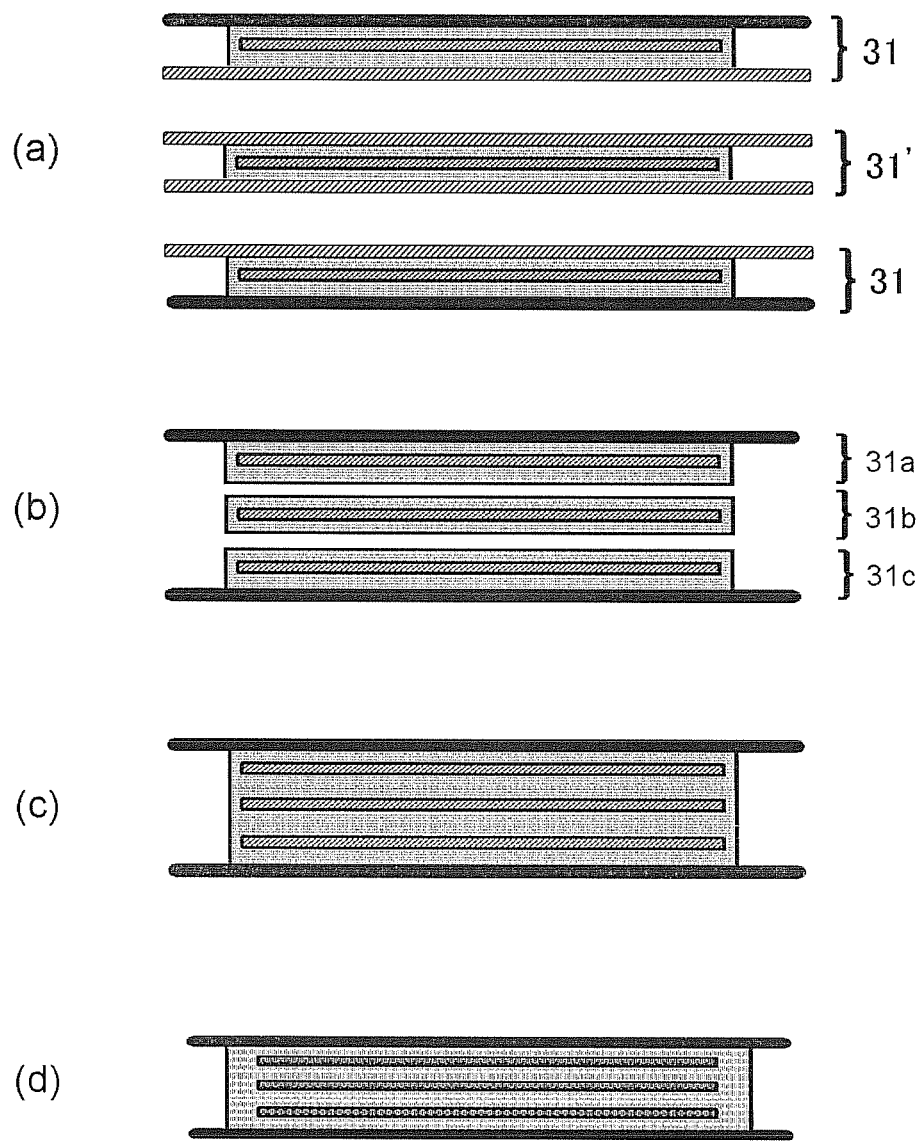
FIG. 7 is a schematic cross-sectional process chart illustrating an example of manufacturing a laminated board using three prepregs with a carrier in the manufacturing method of this embodiment.
Figure 8:
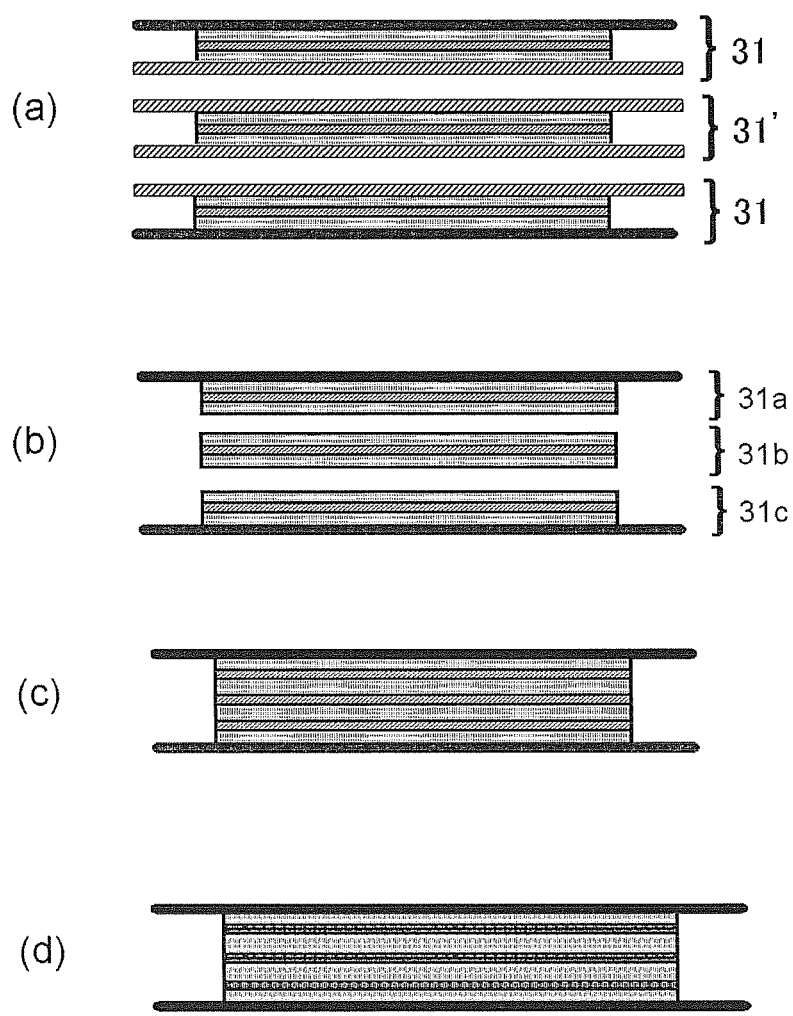
FIG. 8 is a schematic cross-sectional process chart illustrating an example of manufacturing a laminated board using three prepregs with a carrier in the manufacturing method of this embodiment.

In this embodiment, the aspect illustrated in FIGS. 7 and 8 may have a configuration where a film-shaped insulating resin member 31b in which an insulating resin layer is exposed in both sides is inserted between the first prepreg 31a with a carrier and the film-shaped insulating resin member 31b, to form a laminated board in which four or more prepregs with a carrier are laminated.

Embodiment A3

In a method for manufacturing a laminated board of Embodiment A3, Step (1) includes the following steps (a) to (d) and Step (2) includes the following steps (e) to (f).

(a) laminating a fiber cloth with a first and a second carriers with an insulating resin layer having a carrier on one side such that the sides of the fiber cloth are attached to the insulating resin layer sides in the first and the second carriers with an insulating resin layer in which the carrier is formed in one side, respectively and bonding them under reduced pressure, (b) after the bonding, heating the laminate at a temperature of a glass transition temperature of an insulating resin component constituting the insulating resin layer or higher to prepare a two-side prepreg with a carrier, (c) repeating steps (a) and (b) to prepare a first and a second two-side prepregs with a carrier, and to prepare a third two-side prepreg with a carrier, (d) removing said carrier from one side of each of the first and the second two-side prepregs with a carrier to expose the insulating resin layer, and the carriers in both sides of the third two-side prepreg with a carrier are removed to prepare a film-shaped insulating resin member in which the insulating resin layer is exposed in both sides, (e)

(e1) under reduced pressure, bonding the insulating resin layer of the first prepreg with a carrier and the insulating resin layer of the second prepreg with a carrier via a film-shaped insulating resin member as an additional member, to form a laminate having carriers in both outermost layers and then removing at least one carrier in the laminate to expose the insulating resin layer, (e2) directly or via the additional member bonding the exposed insulating resin layer in the laminate with the insulating resin layer of the other prepreg with a carrier under reduced pressure, and (f) after step (e), heating the product for laminating the first prepreg with a carrier, the film-shaped insulating resin member and the second prepreg with a carrier in sequence.

In this embodiment, the same steps as those in Embodiment A1 or A2 will not be repeated as appropriate. In the following steps, procedures conducted as described in Embodiment A1 will not be repeated as appropriate.

Figure 9:
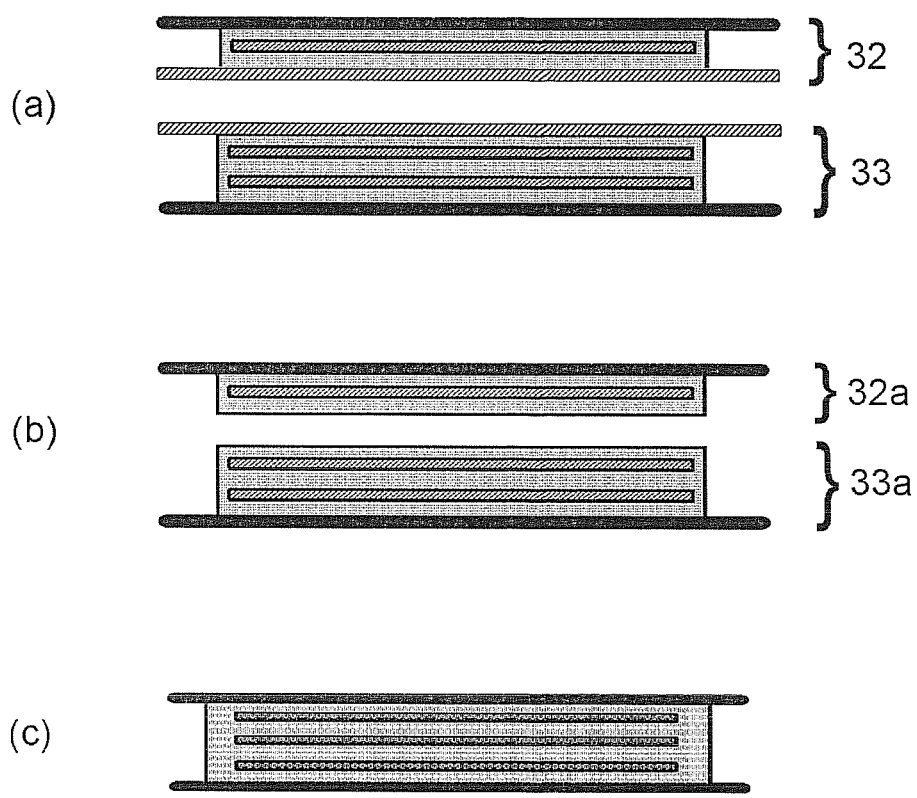
FIG. 9 is a schematic cross-sectional process chart illustrating an example of manufacturing a laminated board using three prepregs with a carrier in the manufacturing method of this embodiment.

In step (e1), under reduced pressure, the insulating resin layer of the first prepreg with a carrier and the insulating resin layer of the second prepreg with a carrier are bonded directly or via an additional member, to form a laminate 33 having carriers in both outermost layers as shown in FIG. 9(a). Then, separately, a two-side prepreg 32 with a carrier is formed (FIG. 9(a)). The laminate 33 can be prepared as described for the laminated in FIG. 5(d).

In the laminate 33, the carrier in one of the outermost layers is peelable. In the two-side prepreg 32 with a carrier, the carrier in one side is peelable.

Then, as shown in FIG. 9(b), the carrier in one side of the laminate 33 is removed to give a laminate 33a in which the insulating resin layer is exposed, and the carrier in one side of the two-side prepreg 32 with a carrier is removed to give a prepreg 32a with a carrier in which the insulating resin layer is exposed.

In step (e2), the exposed insulating resin layer in the laminate 33a is bonded with the insulating resin layer of the prepreg 32a with a carrier directly or via the additional member bonding under reduced pressure (FIG. 9(c)). The additional member may be, for example, a film-shaped insulating resin member formed by removing the carriers in both sides of a two-side prepreg with a carrier.

Then, step (f) can be conducted to provide a laminated board.

In step (f) of this embodiment, it is preferable that the laminated prepared in step (e) is carried out under an ambient pressure while being continuously heated under an ambient pressure. Thus, spaces in a glass cloth are filled with a molten resin and then the product is molded under atmospheric pressure, so that while void formation is effectively prevented, a laminate exhibiting further excellent insulation reliability can be manufactured.

A heating temperature may be 60° C. or more and 200° C. or less, preferably 150° C. or more and 200° C. or less. Thus, flowability of an insulating resin is improved and a curing reaction of the insulating resin adequately proceeds, so that void formation can be more effectively prevented.

There are no particular restrictions to heating time which may vary depending on, for example, the type of an insulating resin used; for example, 10 to 20 min.

Although in this embodiment, an aspect in which the prepreg 32a with a carrier is laminated with the one side of the laminate 33a is described, the carriers in both sides of the laminate 33 may be removed and then the prepreg 32a with a carrier may be laminated with each of both sides of the exposed insulating resin layer. Alternatively, the laminates 33 may be laminated and a prepreg with a carrier may be further laminated. Thus, by laminating a prepreg with a carrier and/or a laminate as appropriate, a laminated board in which four or more prepregs with a carrier are laminated.

In the method for manufacturing a laminated board of this embodiment,
the configurations shown in FIGS. 2(a) to (c), FIGS. 3(a) to (c) FIGS. 5(a) to (d), FIGS. 7(a) to (d) and FIGS. 9(a) to (c) are preferable among the above configurations. In other words, the first prepreg with a carrier and the second prepreg with a carrier are preferably those in which a carrier has a width-directional dimension larger than that of the fiber cloth or the insulating resin layer and the insulating resin layers of these has a width-directional dimension larger than that of the fiber cloth.

Thus, in steps (a) and (e), the fiber cloth can be sealed with the insulating resin layer, and there can be provided a laminated board having few or substantially no voids in the whole region where the fiber cloth is present.

In particular, a prepreg with a carrier used in the present method for manufacturing a laminated board preferably has the configuration illustrated in FIGS. 2(a) to (c), that is, a prepreg where the carrier has a width-directional dimension larger than that of the fiber cloth 4 and the insulating resin layer has a width-directional dimension larger than that of the fiber cloth 4 in the first carrier with an insulating resin layer and the second carrier with an insulating resin layer.

In this configuration, the insulating resin layers of the first and the second carriers with an insulating resin layer are bonded in both sides in a width direction of the fiber cloth 4, so that the fiber cloth 4 can be more easily sealed by the insulating resin layer and thus the above effects can be more effectively achieved.

In terms of a prepreg with a carrier used in a method for manufacturing a laminated board of this embodiment, there is preferably a step of continuously winding the prepreg with a carrier prepared after step (b).

Thus, the prepreg with a carrier may be a roll, which can be used for improving workability of steps (d) and (e).

In terms of a laminated board of this embodiment, there is preferably the step of continuously winding a laminated board having the prepreg with a carrier formed or of cutting the laminated board into a predetermined dimension in a feeding direction at a carrying outlet after step (b).

Thus, a laminated board having a prepreg with a carrier can be in a predetermined shape and efficient production can be effectively achieved.

Manufacturing Apparatus

Figure 10:
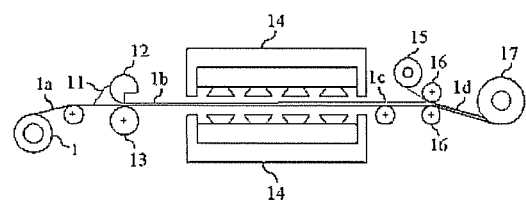
FIG. 10($a$) is a schematic cross-sectional side view illustrating an example of an apparatus configuration for manufacturing a carrier with an insulating resin layer used in the manufacturing process of this embodiment, and FIG. 10($b$) is a schematic cross-sectional view illustrating an example of an apparatus configuration for manufacturing a prepreg with a carrier used in the manufacturing method of this embodiment.
Figure 10:
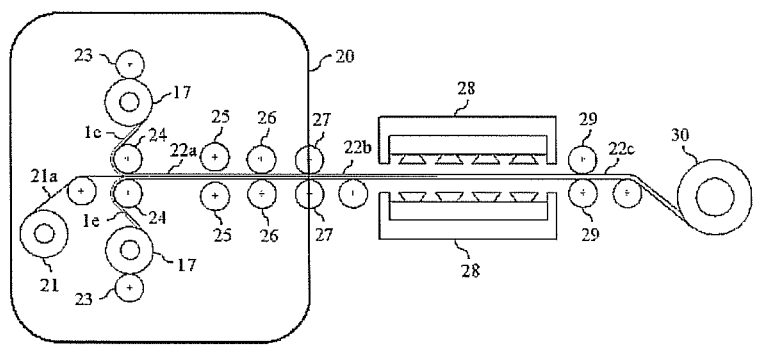
Figure 11:
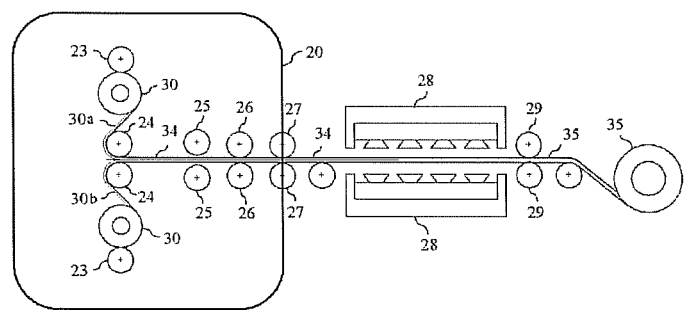
FIG. 11 is a schematic cross-sectional view illustrating an example of an apparatus configuration for manufacturing a laminate using two prepregs with a carrier.
Figure 12:
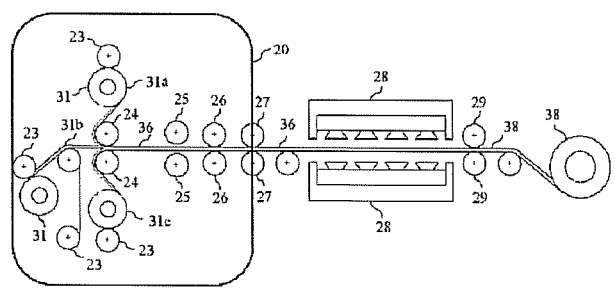
FIG. 12 is a schematic cross-sectional view illustrating an example of an apparatus configuration for manufacturing a laminate using three prepregs with a carrier.

The method for manufacturing a laminated board of this embodiment can be conducted using a manufacturing apparatus illustrated in FIGS. 10 to 12. In FIGS. 10 to 12, the side of the manufacturing apparatus is described using its cross-sectional view.

FIG. 10(a) illustrates an example of an apparatus for manufacturing a carrier with an insulating resin layer used in manufacturing a laminated board having a prepreg with a carrier of this embodiment.

In FIG. 10(a), a carrier is a carrier 1 as, for example, a roll of a long sheet, from which the carrier can be fed by continuous winding off.

A predetermined amount of a liquid insulating resin 11 is fed on a continuously carrier 1a by a feeding machine for the insulating resin (not shown). The coating amount of the insulating resin 11 can be controlled by a comma roll 12 and a clearance of the comma roll 12 with a backup roll 13.

A carrier 1b coated with a predetermined amount of the insulating resin is carried in transverse conveying type hot air dryers 14, 14 for substantially removing, for example, an organic solvent contained in the liquid insulating resin, and, if necessary, may be made into a carrier 1c with an insulating resin layer in which a curing reaction partly proceeds. The carrier 1c with an insulating resin layer may be wound up as it is, but in the configuration of FIG. 10(a), its side in which the insulating resin layer is formed is laminated with a protective film 15 by laminate rolls 16, 16 to form a carrier 1d with an insulating resin layer in which the protective film 15 is laminated, and the product is wound up to give a carrier 17 with an insulating resin layer as a roll.

FIG. 10(b) is a cross-sectional view illustrating an example of an apparatus by which steps (a) to (c) of the manufacturing method of this embodiment can be conducted. Specifically, both sides of the fiber cloth are laminated with the insulating resin layer sides of the carriers with an insulating resin layer, and they can be bonded under reduced pressure, then heated at a temperature equal to or higher than a glass transition temperature of the insulating resin and continuously wound up to prepare a prepreg with a carrier.

In FIG. 10(b), step (a) is conducted using a vacuum laminator 20.

The inside of the vacuum laminator 20 is under the predetermined vacuum conditions by a pressure reducing device such as a vacuum pump (not shown).

Within the vacuum laminator 20, the carriers 17, 17 with an insulating resin layer obtained in step (a) and a fiber cloth 21 are disposed such that they can be continuously fed.

The carriers 17, 17 with an insulating resin layer has the above protective film which is laminated on the surface of the insulating resin layer. They are, therefore, continuously fed as carriers with an insulating resin layer 1e while the protective film is peeled off by the wind-up rolls 23, 23. The fiber cloth 21a is continuously fed from the roll type fiber cloth 21.

The carriers with an insulating resin layer 1e, 1e from which the protective film has been peeled off and a fiber cloth 21a are laminated such that the fiber cloth 21a is sandwiched by the insulating resin layers of the carriers with an insulating resin layer 1e, 1e, and they are bonded by the laminate rolls 24, 24.

A clearance between the laminate rolls 24, 24 can be adjusted such that substantially no pressure is applied or a given pressure is applied, in bonding the carriers with an insulating resin layer and the fiber cloth.

The bonding product 22a after the bonding may be fed to the next step as it is, or heated and compressed by the laminate rolls (25, 25), (26, 26) and (27, 27) for adjusting a bonding degree of the carrier with an insulating resin layer with the fiber cloth.

In FIG. 10(b), the laminate rolls 27, 27 also act as seal rolls for preventing air from entering the inside of the vacuum laminator 20 from the outside in order to maintain the predetermined vacuum conditions in the vacuum laminator 20.

After the bonding, the bonding product 22b is carried between the transverse conveying type hot air dryers 28, 28 while being heated at a temperature equal to or higher than a glass transition temperature of the insulating resin. Thus, unfilled parts remaining within the bonding product can be eliminated.

The prepreg 22c with a carrier after the heating can be continuously wounded up while being sandwiched by pinch rolls 29, 29, to provide a roll type two-side prepreg 30 with a carrier.

FIG. 11 is a side cross-sectional view illustrating an apparatus by which steps (d) to (f) in the manufacturing method of Embodiment A1 can be conducted. Steps (d) and (e) can be conducted using the vacuum laminator 20.

The inside of the vacuum laminator 20 is under the predetermined vacuum conditions by a pressure reducing device such as a vacuum pump (not shown).

Within the vacuum laminator 20, the prepregs 30a, 30b with a carrier obtained in step (d) are disposed such that each of them can be continuously fed.

Since a carrier is laminated on the insulating resin layer surface in the two-side prepregs 30 with a carrier, they are continuously fed while the carrier is peeled off by the wind-up rolls 23, 23. The prepregs 30a, 30b with a carrier in which the carrier has been peeled off are laminated in their insulating resin layer sides and bonded by the laminate rolls 24, 24.

A clearance between the laminate rolls 24, 24 can be adjusted such that substantially no pressure is applied or a given pressure is applied, in bonding the carriers with an insulating resin layer and the fiber cloth.

The bonding product 34 after the bonding may be fed to the next step as it is, or heated and compressed by the laminate rolls (25, 25), (26, 26) and (27, 27) for adjusting a bonding degree of the insulating resin layer sides of the prepregs with a carrier.

In FIG. 11, the laminate rolls 27, 27 also act as seal rolls for preventing air from entering the inside of the vacuum laminator 20 from the outside in order to maintain the predetermined vacuum conditions in the vacuum laminator 20.

After the bonding, the bonding product 34 is carried between the transverse conveying type hot air dryers 28, 28 while being heated at a temperature within a predetermined range. Thus, unfilled parts remaining within the bonding product can be eliminated.

The laminated board 35 after the heating can be continuously wounded up while being sandwiched by pinch rolls 29, 29, to provide a roll type laminated board 35.

The laminated board of Embodiment A3 can be also manufactured using the manufacturing apparatus of FIG. 11.

FIG. 12 is a side cross-sectional view illustrating an apparatus by which steps (d) to (f) in the manufacturing method of Embodiment A2 can be conducted. Step (d) can be conducted using the vacuum laminator 20. In FIG. 12, equivalent elements are denoted by similar symbols, for which description will not be repeated as appropriate.

Within the vacuum laminator 20, the prepreg 31a with a carrier, the insulating resin member 31b and the prepreg 31c with a carrier obtained in step (d) are disposed such that each of them can be continuously fed.

The prepregs 31a, 31c with a carrier are continuously fed while the carrier in one side is peeled off from each of the two-side prepregs 31,31 with a carrier by a wind-up roll 23. The insulating resin member 31b is continuously fed while the carriers in both sides are peeled off from the two-side prepreg 31 with a carrier by wind-up rolls 23, 23. The insulating resin member 31b in which the carriers in both sides have been peeled off is laminated with the insulating resin layer sides of the prepregs 31a, 31c with a carrier, and the laminate is bonded by the laminate rolls 24, 24.

The bonding product 36 after the bonding may be fed to the next step as it is, or heated and compressed by the laminate rolls (25, 25), (26, 26) and (27, 27) for adjusting a bonding degree of the insulating resin layer sides of the prepregs with a carrier.

After the bonding, the bonding product 36 is carried between the transverse conveying type hot air dryers 28, 28 while being heated at a temperature within a predetermined range. Thus, unfilled parts remaining within the bonding product can be eliminated.

The laminated board 38 after the heating can be continuously wounded up while being sandwiched by pinch rolls 29, 29, to provide a roll type laminated board 38.

In this embodiment, when a laminated board is manufactured using four or more prepregs with a carrier, there may be an additional apparatus for removing both carriers from the two-side prepreg 31 with a carrier and continuously feeding it.

There will be described a laminated board prepared using the prepreg with a carrier of this embodiment.

The laminated board having the prepreg with a carrier of this embodiment can be manufactured by a method for manufacturing the prepreg with a carrier of this embodiment.

In the metal foil in the laminated board having the prepreg with a carrier obtained in this embodiment can be etched to form a desired conductor circuit.

As described above, according to the manufacturing method of this embodiment there is provided a method for continuously manufacturing a laminated board using a prepreg with a carrier having an insulating resin layer including a backbone material of a fiber cloth, and this method can easily manufacture a laminated board with good impregnation properties and thickness precision which exhibits excellent insulation reliability. In particular, when a thin fiber cloth is used, it can provide a laminated board with less internal strain and good impregnation properties.

Furthermore, a laminated board prepared using a prepreg with a carrier of the present invention exhibits excellent mechanical properties such as warpage and dimension stability as well as moldability, and can be suitably used for an application such as a printed wiring board required to be highly integrated and multilayered, which must be highly reliable.

Embodiment B

There will be detailed a method for manufacturing a laminated board using a prepreg with a carrier of Embodiment B, and a laminated board with reference to the drawings. In all the drawings, equivalent elements are denoted by similar symbols, for which description will not be repeated as appropriate.

Embodiment B1

A method for manufacturing a laminated board according to Embodiment B1 is a method where a first and a second long-strip prepregs with a carrier are continuously laminated and all the following steps are continuously repeated.

(a) preparing a first and a second long-strip two-side prepregs with a carrier by laminating a carrier, an insulating resin layer in which a fiber cloth is embedded, and another carrier, (b) peeling off the carrier in one side of each of the first and the second two-side prepregs with a carrier to prepare the first and the second long-strip prepregs with a carrier in which the insulating resin layer in one side is exposed, (c) directly abutting the insulating resin layers in the first and the second long-strip prepregs with a carrier under reduced pressure while pressing the laminate by a pair of laminate rolls to bond the insulating resin layers together, and (d) heating the laminate formed in the preceding step.

First, there will be described step (a).

In this embodiment, step (a) includes the following steps (a1) and (a2).

(a1) Under reduced pressure, the sides of a fiber cloth are bonded to the insulating resin layer sides in a first and a second long-strip carrier with an insulating resin layer in which the carrier is formed in one side, respectively.

(a2) After the bonding, the laminate is heated at a temperature equal to or higher than a glass transition temperature of an insulating resin component constituting the insulating resin layer to prepare a first and a second long-strip two-side prepregs with a carrier.

It is preferable In this embodiment to adjust a thickness of the laminated board to 30 µm or more and 200 µm or less in the light of productivity. Thus, a two-side prepreg with a carrier may be prepared such that a thickness of the laminated board is within the above range; for example, two or more and four or less two-side prepregs with a carrier may be used. A fiber cloth may be appropriately combined. This embodiment will be described for an example where a couple of two-side prepregs with a carrier are used.

First, there will be described step (a1).

In step (a1), the sides of a long-strip fiber cloth are attached to the insulating resin layer sides in a first and a second long-strip carriers with an insulating resin layer in which the carrier is formed in one side, respectively and these are bonded under reduced pressure.

Thus, during bonding the insulating resin layer in the carrier with an insulating resin layer with the fiber cloth, unfilled parts within the fiber cloth or a bonding interface between the insulating resin layer in the carrier with an insulating resin layer, if present, can be made into low-pressure voids or substantially vacuum voids.

The step is preferably conducted under the condition of a vacuum degree of 60 Torr. More preferably, it is conducted under the condition of a vacuum degree of 20 Torr. Thus, the above effects can be considerably achieved.

The first carrier with an insulating resin layer and the second carrier with an insulating resin layer used in step (a1) may be the same or different. Here, a carrier with an insulating resin layer means a metal foil with an insulating resin layer or a resin film with an insulating resin layer.

The first long-strip carrier with an insulating resin layer and the second long-strip carrier with an insulating resin layer can be bonded with the fiber cloth, for example, by, but not limited to, bonding the fiber cloth with the carriers with an insulating resin layer while they are continuously fed and laminated.

The bonding under reduced pressure can be conducted by using, but not limited to, an appropriate apparatus such as a vacuum laminator and a vacuum box apparatus.

Among these, it is preferable that using a vacuum laminator, the long-strip fiber cloth and the long-strip carriers with an insulating resin layer are bonded while they are continuously laminated. Thus, a continuous processing is allowed, so that a prepreg with a carrier can be efficiently prepared by a simple apparatus.

In step (a1), it is preferable that when the insulating resin layer side of the carrier with an insulating resin layer is bonded to the fiber cloth, they are heated to a temperature at which flowability of the resin components in the insulating resin layer is improved. Thus, the fiber cloth and the insulating resin layer can be easily bonded. Furthermore, at least part of the insulating resin layer is molten and impregnates the fiber cloth, to facilitate production of a prepreg with a carrier exhibiting excellent impregnation properties.

There are no particular restrictions to a heating method, and for example, laminate rolls heated at a predetermined temperature can be suitably used during bonding. A heating temperature may vary depending on the type and the composition of a resin constituting an insulating resin layer, and specifically, may be 60 to 100° C.

There will be described a carrier with an insulating resin layer used in step (a1). In the drawings, a part of the long-strip carrier with an insulating resin layer is used for description.

FIG. 1(b) illustrates a long-strip carrier 3 with an insulating resin layer used in this embodiment.

In the carrier 3 with an insulating resin layer, an insulating resin layer 2 is formed as a thin layer in one side of a carrier 1. The insulating resin layer 2 has a width-directional dimension 8, and can be formed in one side of the carrier 1 to a predetermined thickness. Here, the width-directional dimension 8 refers to a dimension of the insulating resin layer 2 in a direction perpendicular to the carrying direction (longitudinal direction) of the carrier 1.

There will be described a carrier used in the above carrier with an insulating resin layer.

FIG. 1(a) illustrates a carrier 1 applied to a carrier 3 with an insulating resin layer used in this embodiment.

The carrier 1 can be fed by continuously carrying it in the direction of an arrow 6, and has a width-directional dimension 7. Here, a width-directional dimension 7 refers to a dimension in a direction perpendicular to the carrying direction of the carrier 1.

A suitable example of the carrier 1 may be a long sheet.

Examples of a material for a carrier include, but not limited to, a thermoplastic resin film sheet made from a thermoplastic resin such as polyethylene terephthalate, polyethylene and a polyimide, or a metal foil made of a metal such as copper or a copper alloy, aluminum or an aluminum alloy and silver or a silver alloy.

Among these, polyethylene terephthalate is preferable as a thermoplastic resin for forming a thermoplastic resin film sheet because it is highly heat resistant and inexpensive.

As a metal for forming a metal foil, copper or a copper alloy is preferable because it is highly conductive, allows a circuit to be easily formed by etching and is inexpensive.

When a thermoplastic resin film sheet is used as the carrier, it is preferable that a surface on which an insulating resin layer is to be formed is processed to be peelable. Thus, the insulating resin layer can be easily separated from the carrier during or after production of a multilayer printed wiring board.

A thickness of this thermoplastic resin film sheet may be 25 to 75 μm. Thus, workability during preparing a carrier with an insulating resin layer may be improved.

If a thickness of the thermoplastic resin film sheet is too small, mechanical strength may be inadequate during preparing the carrier with an insulating resin layer. If the thickness is too large, there are no problems in preparing the carrier with an insulating resin layer, but productivity in preparing the carrier with an insulating resin layer may be deteriorated.

When a metal foil is used as the carrier, it may be one where a surface on which an insulating resin layer is to be formed is processed to be peelable, or alternatively, one which is not subjected to such processing or which is processed to be more adhesive to the insulating resin layer may be used.

When a metal foil where a surface on which the insulating resin layer is to be formed is processed to be peelable is used as the carrier, it may be effective as in the case where the thermoplastic resin film sheet is used.

A thickness of this metal foil may be 1 to 70 μm. Thus, workability during preparing a carrier with an insulating resin layer may be improved.

If a thickness of the metal foil is too small, mechanical strength may be inadequate during preparing the carrier with an insulating resin layer. If the thickness is too large, there are no problems in preparing the carrier with an insulating resin layer, but productivity of a laminated board may be deteriorated.

When a metal foil which is unprocessed to be peelable or is processed to be more adhesive to the insulating resin layer is used as the carrier, the metal foil as such can be used as a conductor layer for forming a circuit when preparing a multilayer printed wiring board.

The carrier surface in the side in which the insulating resin layer is to be formed may have irregularity of, for example, Ra: 0.1 to 0.5 μm. Thus, adhesiveness between the insulating layer and the metal foil ca be adequately ensured, and by processing this metal foil by, for example, etching, a fine circuit may be easily processed/formed.

The metal foil may preferably have a thickness of 1 to 35 μm. If the metal foil has a too small thickness, mechanical strength may be inadequate during preparing a carrier with an insulating resin layer. If the thickness is too large, it may become difficult to process/form a fine circuit. In other words, a thickness of the metal foil within the above range allows both mechanical strength and processing properties to be satisfactory.

When a couple of two-side prepregs with a carrier are used for manufacturing a laminated board, this metal foil can be used as a carrier in one of the two-side prepregs with a carrier. When three or more prepregs with a carrier are used for manufacturing a laminated board, this metal foil cannot be used in a prepreg with a carrier sandwiched by two prepregs with a carrier as the outermost layers in the laminated board. In such a case, when the metal foil is peeling-processed, it may be used.

A metal foil used in such an application may be a metal foil formed from one layer or a metal foil consisting of two or more metal foil layers which are peelable from each other. For example, a two-layer structure metal foil may be used, in which a first metal foil in the side where an insulating resin layer is to be bonded is bonded to a second metal foil capable of supporting the first metal foil in the opposite side to the side where the insulating layer is to be bonded.

There will be described insulating resin materials for forming the insulating resin layer in the carrier with an insulating resin layer.

An insulating resin material used for forming an insulating resin layer may have a melt viscosity (complex viscosity coefficient) of 0.1 MPa·s or less, preferably 0.01 MPa·s or less in a temperature range of 60° C. or more and 200° C. or less. Thus, even when a plurality of long-strip prepregs are continuously laminated using laminate rolls, void formation in the insulating resin layer can be effectively prevented, resulting in an improved product yield. The lower limit of a melt viscosity for the insulating resin material may be substantially 10 Pa·s in the light of the above effect.

The above melt viscosity is a complex viscosity coefficient determined at a frequency of 1 radian/sec in dynamic viscoelastic measurement at 60° C. or more and 200° C. or less. This melt viscosity can be measured using a complex viscosity coefficient dynamic viscoelastic measuring device by a procedure where a disc sample with a diameter of 25 mm and a thickness of 0.8 mm is pinched by a jig and measurement is conducted while the sample is twisted at a frequency of 1 Hz under each temperature atmosphere with heating.

Suitable examples of such an insulating resin material include thermosetting resins including epoxy resins such as bisphenol-A type epoxy resins, bisphenol-F type epoxy resins, novolac epoxy resins, cresol novolac type epoxy resins, biphenyl type epoxy resins, naphthalene type epoxy resins, arylalkylene type epoxy resins, biphenyl dimethylene type epoxy resins and prepolymers of these;

phenol resins such as novolac type phenol resins, resol type phenol resins, arylalkylene type phenol resins and prepolymers of these;

cyanate resins such as novolac type cyanate resins, bisphenol-A type cyanate resins, bisphenol-E type cyanate resins, tetramethyl bisphenol-F type cyanate resins and prepolymers of these;

unsaturated polyester resins; dicyclopentadiene resins; and bismaleimide triazine resin. In this embodiment, these thermosetting resins may be used alone or in combination of two or more.

In addition, it may contain, if needed, additives such as a curing agent, a curing accelerator, a thermoplastic resin, an inorganic filler, an organic filler and a coupling agent as appropriate.

An insulating resin used in this embodiment may be suitably used as a liquid in which the above components are dissolved and/or dispersed in, for example, an organic solvent.

There will be described the long-strip carrier with an insulating resin layer.

A carrier with an insulating resin layer used in the present invention has an insulating resin layer made from the above insulating resin material on one side of the carrier. The layer can be formed by, but not limited to, applying a liquid insulating resin a carrier using any of various coaters such as a comma coater and a knife coater, or applying a liquid insulating resin on a carrier using any of various spraying devices such as a spray nozzle.

Among these, it is preferable to apply a liquid insulating resin on a carrier using any of various coaters. Thus, a convenient apparatus can be used to form an insulating resin layer with excellent thickness precision.

When preparing a carrier with an insulating resin layer, a liquid insulating resin can be applied on a carrier, which can be, if necessary, then dried at an ambient temperature or under heating.

Thus, when an organic solvent or dispersion medium is used for preparing a liquid insulating resin, it can be substantially removed to make the surface of the insulating resin layer non-tacky, giving a carrier with an insulating resin layer with excellent handling properties.

Alternatively, after partly curing the insulating resin, fluidity of the insulating resin in step (a) or step (b) described below can be adjusted.

There are no particular restrictions to the drying method under heating; for example, continuous processing using a hot air oven or infrared heater may be suitably applied.

In a carrier with an insulating resin layer used in this embodiment, a thickness of the insulating resin layer may be appropriately selected, depending on a thickness of a fiber cloth used, and may be 5 to 100 µm.

This insulating resin layer may be formed by applying the same insulating resin once or more, or applying different insulating resins twice or more.

After thus forming a carrier with an insulating resin layer, a protecting film can be laminated on the upper surface of the insulating resin layer formed, that is, the opposite side to that having a carrier for protecting the surface of the insulating resin layer.

There will be described a style for laminating a carrier with an insulating resin layer and a fiber cloth.

FIG. 1(c) shows an example of style 5 for laminating a carrier 3 with an insulating resin layer and a fiber cloth 4.

The fiber cloth 4 can be continuously fed/carried in the same direction as the carrying direction of a carrier 1 and has a width-directional dimension 9. Here, the width-directional dimension 9 refers to a dimension of the fiber cloth 4 in a direction perpendicular to a feeding direction in the fiber cloth 4. Such a fiber cloth 4 may be, for example, suitably a long sheet.

Examples of a material for the fiber cloth include, but not limited to, fiber cloths such as woven glass fabric and unwoven glass fabric; inorganic fiber cloths such as woven and unwoven fabrics containing an inorganic compound other than glass as a component; and organic fiber cloths such as aromatic polyamide resins, polyamide resins, aromatic polyester resins, polyester resins, polyimide resins and fluororesins.

Among these, a glass fabric which is a glass fiber cloth, can be used to improve mechanical strength and heat resistance of a multilayer printed wiring board.

When a glass fabric as the fiber cloth is used, it may have a thickness of 15 to 180 µm. Its grammage (a weight of a fiber cloth per 1 m$^2$) may be, for example, 17 to 209 g/m$^2$.

In a manufacturing method of this embodiment, particularly, a thin glass fabric with a thickness of 15 to 35 µm and a grammage of 17 to 25 g/cm$^2$ can be used. Even when such a glass fabric is used, a laminated board having a prepreg with a carrier exhibiting excellent mechanical properties and impregnating properties can be obtained because fiber bundles constituting the fiber cloth is resistant to bending.

A conventional method for manufacturing a prepreg, for example, a method where a fiber cloth is immersed in a resin varnish for impregnation and then dried using a common applicator. This method has a problem that during passing it through a number of carrying rolls or adjusting the amount of the insulating resin impregnated in the fiber cloth, the fiber cloth tends to be subjected to stress.

The effect is prominent particularly when a thin glass fabric is used; specifically, tendency to bending of the fiber bundles or expansion of an opening between warps and woofs. A laminated board having such a prepreg has internal strain, which may cause warpage of a multilayer printed wiring board and affect its mechanical properties such as dimensional stability.

A conventional method for manufacturing a prepreg, for example, a method where a fiber cloth is immersed in a resin varnish for impregnation and then dried using a common applicator, and this drying method is conducted while a uncured resin varnish remains as a coating on the surface of the fiber cloth. Thus, a viscosity of the resin varnish is reduced in a drying furnace, causing dripping and surface unevenness due to hot air, which lead to unsatisfactory thickness precision.

In a method for preparing a laminated board using this prepreg by batch press, a thickness can be made within a desired range by high-pressure molding, but curing under high pressure causes internal residual strain. It leads to warpage of a multilayer printed wiring board and affects mechanical properties such as dimensional stability.

On the other hand, in a low-pressure molding in which internal strain is prevented, resin flow under vacuum is insufficient to remove residual voids in the prepreg and a laminated board having residual voids is often provided, and when such a prepreg is used for manufacturing a laminated board, insulation reliability is deteriorated.

In contrast, in a method for manufacturing a laminated board having a prepreg with a carrier of this embodiment, a fiber cloth is not substantially subjected to a stress irrespective of a thickness or grammage of a fiber cloth or the number and the total thickness of laminated layers, so that fiber bundles are resistant to bending and a laminated board exhibiting excellent impregnation properties and improved thickness precision can be prepared.

Next, there will be described step (a2).

In step (a2), after the bonding in step (a1), the laminate is heated at a temperature equal to or higher than a glass transition temperature of an insulating resin component constituting the insulating resin layer to prepare a first and a second two-side prepregs with a carrier.

Thus, low-pressure voids or substantially vacuum voids remaining after laminating the carriers with an insulating resin layer with the fiber cloth in step (a1) can be eliminated to provide a prepreg with a carrier having a very few unfilled parts or substantially free from an unfilled part.

The heating may be conducted, for example, using an apparatus including, but not limited to, a hot air oven, an infrared heater, a heating roller and a flat hot-platen press.

When a hot air oven or infrared heater is used, heating can be conducted substantially without applying a pressure to the laminate.

When a heating roller or flat hot-platen press is used, heating can be conducted with applying a predetermined pressure to the laminate.

Among these, heating is preferably conducted substantially without applying a pressure to the laminate.

According to this method, the resin components do not excessively flow in step (b), so that a prepreg with a carrier having a desirable and highly even insulating-layer thickness can be efficiently prepared.

As the resin components flow, a stress to the fiber cloth base material can be minimized, resulting in a very small internal strain.

Furthermore, a pressure is not substantially applied when the resin components are molten, so that defective dents can be substantially eliminate in this step.

A temperature during the heating may be a glass transition temperature or higher, at which an insulating resin become flowable while a curing reaction of the insulating resin does not rapidly proceed.

There are no particular restrictions to a heating time which depends on factors such as the type of an insulating resin used; for example, the heating can be conducted for 1 to 10 min.

There will be described a two-side prepreg with a carrier provided in step (a2) with reference to the configurations illustrated in FIGS. 2(a) to (c), 3(a) to (c) and 4(a) to (c).

First, the configurations illustrated in FIGS. 2(a) to (c) will be described.

In FIG. 2(a) to (c), the first carrier 3a' with an insulating resin layer and the second carrier 3a with an insulating resin layer have a carrier having a width-directional dimension larger than that of the fiber cloth 4 and an insulating resin layer having a width-directional dimension larger than that of the fiber cloth 4. Here, FIG. 2(a) shows relation in a width-directional dimension for each of a carrier, an insulating resin layer and a fiber cloth.

The carrier in the first carrier 3a' with an insulating resin layer is peelable from the insulating resin layer. This carrier may be a film sheet or metal foil in which the side on which the insulating resin layer is to be formed is processed to be peelable. On the other hand, the carrier in the second carrier 3a with an insulating resin layer is tightly attached to the insulating resin layer. This carrier may be a metal foil processed to be more adhesive to the insulating resin layer.

In this configuration, in step (a1), the insulating resin layer of the first carrier 3a' with an insulating resin layer and the fiber cloth 4, and the insulating resin layer of the second carrier 3a with an insulating resin layer and the fiber cloth 4, respectively, may be laminated in the inner region of the carrier with an insulating resin layer in a width-directional dimension, that is, a region where the fiber cloth 4 is present.

In the outer region of the fiber cloth 4 in the width-directional dimension, that is, a region where the fiber cloth is absent, the insulating resin layer surface in the first carrier 3a' with an insulating resin layer and the insulating resin layer surface in the second carrier 3a with an insulating resin layer can be directly bonded and the fiber cloth 4 can be sealed by the insulating resin layer. The status is illustrated in FIG. 2(b).

Furthermore, since these bonding are conducted under a reduced pressure, remaining unfilled parts, if present, within the fiber cloth 4 or the bonded surface between the insulating resin layers of the first and the second carriers 3a', 3a with an insulating resin layer and the fiber cloth 4 can be made low-pressure voids or substantially vacuum voids, so that in step (a2), heating at a temperature equal to or higher than the glass transition temperature of the resin can easily eliminate them. Furthermore, in step (a2), new void formation due to the air entering from the periphery in the width direction can be prevented. The status is illustrated in FIG. 2(c).

Next, the configurations illustrated in FIGS. 3(a) to (c) will be described.

In FIG. 3(a) to (c), for example, the first carrier 3a' with an insulating resin layer has an insulating resin layer having a width-directional dimension larger than that of the fiber cloth 4, and the second carrier 3b with an insulating resin layer has an insulating resin layer having a width-directional dimension equal to that of the fiber cloth 4. Here, FIG. 3(a) shows relation in a width-directional dimension for each of a carrier, an insulating resin layer and a fiber cloth.

The carrier in the first carrier 3a' with an insulating resin layer is peelable from the insulating resin layer. This carrier may be a film sheet or metal foil in which the side on which the insulating resin layer is to be formed is processed to be peelable. On the other hand, the carrier in the second carrier 3b with an insulating resin layer is tightly attached to the insulating resin layer. This carrier may be a metal foil processed to be more adhesive to the insulating resin layer.

In this configuration, in step (a1), the insulating resin layer of the first carrier 3a' with an insulating resin layer and the fiber cloth 4, and the insulating resin layer of the second carrier 3b with an insulating resin layer and the fiber cloth 4, respectively, may be laminated in the inner region of the carriers with an insulating resin layer in a width-directional dimension, that is, a region where the fiber cloth 4 is present.

In the outer region of the fiber cloth 4 in the width-directional dimension, that is, a region where the fiber cloth is absent, the insulating resin layer surface in the first carrier 3a' with an insulating resin layer and the carrier surface in the second carrier 3b with an insulating resin layer can be directly bonded. The status is illustrated in FIG. 3(b).

Furthermore, since these bonding are conducted under a reduced pressure, remaining unfilled parts, if present, within the fiber cloth 4 or the bonded surface between the insulating resin layer of the first and the second carriers 3a', 3b with an insulating resin layer and the fiber cloth 4 can be made low-pressure voids or substantially vacuum voids, so that in step (a2), heating at a temperature equal to or higher than the glass transition temperature of the resin can easily eliminate them. Furthermore, in step (a2), new void formation due to the air entering from the periphery in the width direction can be prevented. The status is illustrated in FIG. 3(c).

Next, the configurations illustrated in FIGS. 4(a) to (c) will be described.

In FIG. 4(a) to (c), the first and the second carriers 3b',3b with an insulating resin layer have an insulating resin layer having a width-directional dimension equal to that of the fiber cloth 4. Here, FIG. 4(a) shows relation in a width-directional dimension for each of a carrier, an insulating resin layer and a fiber cloth.

The carrier in the first carrier 3b' with an insulating resin layer is peelable from the insulating resin layer. This carrier may be a film sheet or metal foil in which the side on which the insulating resin layer is to be formed is processed to be peelable. On the other hand, the carrier in the second carrier 3b with an insulating resin layer is tightly attached to the insulating resin layer. This carrier may be a metal foil processed to be more adhesive to the insulating resin layer.

In this configuration, in step (a1), the insulating resin layer of the first carrier 3b' with an insulating resin layer and the fiber cloth 4, and the insulating resin layer of the second carrier 3b with an insulating resin layer and the fiber cloth 4, respectively, may be laminated in the inner region of the carrier with an insulating resin layer in a width-directional dimension, that is, a region where the fiber cloth 4 is present. The status is illustrated in FIG. 4(b).

In this configuration, it is preferable that after step (a1), that is, after the first and the second carriers 3b', 3b with an insulating resin layer are laminated with the fiber cloth 4, unfilled parts present in the end in a width direction are not communicated with unfilled parts present in an area other than the end in the width direction.

Thus, the unfilled parts present in the area other than the end in the width direction can be made low-pressure voids or substantially vacuum voids because step (a1) is conducted under a reduced pressure, and these can be easily eliminated by heating at a temperature equal to or higher than the glass transition temperature of the resin in step (a2). In step (a2), new void formation due to the air entering from the periphery in the width direction can be restricted to the end in the width direction. This status is illustrated in FIG. 4(c).

Next, there will be described step (b).

In this step (b), as shown in FIGS. 5(a) and (b) (or FIGS. 6(a) and (b)), the carrier in one side of each of the first and the second two-side prepregs 30, 30 with a carrier obtained in the above step is peeled off, to prepare the first and the second long-strip prepregs 30a, 30b with a carrier in which the insulating resin layer in one side is exposed.

The carrier in the prepreg with a carrier can be removed by, but not limited to, continuously feeding the two-side prepregs with a carrier while a carrier in one side in each of the two-side prepregs with a carrier is continuously wound.

Next, there will be described step (c).

In this step (c), as shown in FIGS. 5(b) and (c) (or FIGS. 6(b) and (c)), the insulating resin layers in the first and the second long-strip prepregs 30a, 30b with a carrier are directly abutted under reduced pressure while pressing the laminate by a pair of laminate rolls to bond the insulating resin layers together.

Thus, even when there is a space in a bonding interface between the laminated insulating resin layers during bonding of the prepregs with a carrier, the space can be made into a low-pressure or substantially vacuum void.

In terms of the vacuum conditions, a vacuum degree is 20 Torr or less, preferably 10 Torr or less. Thus, the above effects can be substantially achieved. There are no particular restrictions to the lower limit, and 1 Torr or more may be acceptable in the light of the above effects.

The prepregs with a carrier prepared by the method as described above are used and laminated under the vacuum conditions as described above, so that a laminated board exhibiting excellent thickness precision can be obtained.

A laminate pressure in pressing by a pair of laminate rolls may be 1 N/cm$^2$ or more and 50 N/cm$^2$ or less, preferably 1 N/cm$^2$ or more and 10 N/cm$^2$ or less. When a plurality of long-strip prepregs with a carrier are continuously fed for bonding in one lump, spaces tends to be formed in an interface between the insulating resin layers, which may deteriorate insulation reliability of a laminated board. In this embodiment employing a laminate pressure within the above range, spaces in an interface between the insulating resin layers can be, if present, effectively reduced, so that a laminate exhibiting excellent insulation reliability can be provided.

Such an effect can be more prominent in combination with the above vacuum conditions.

The two prepregs with a carrier may be bonded by continuously feeding the two prepreg with a carrier in which the carrier in one side has been removed while their insulating resin layers are laminated and then pressing the laminate by a pair of laminate rolls.

There are no particular restrictions to a method for bonding under reduced pressure, and for example, a vacuum laminator or vacuum box apparatus may be used.

Among these, it is preferable that using a vacuum laminator, the first and the second prepregs with a carrier in which the carrier in one side is removed are continuously laminated while being bonded. This allows for continuous processing and for efficient production of a laminated board using prepregs with a carrier by a simple apparatus.

In step (c) the prepregs with a carrier in which the carrier is removed are preferably heated at a predetermined temperature while being bonded. Thus, the insulating resin layer sides of the prepregs with a carrier in which the carrier is removed can be easily bonded. Furthermore, the insulating resin layer is at least partly molten during bonding, which facilitates production of a laminated board with reduced interlayer voids.

There are no particular restrictions to a heating method, and for example, a method employing a laminate roll heated to a predetermined temperature can be suitably used.

There are no particular restrictions to a heating temperature, which varies depending on the type and the composition of a resin forming the insulating resin layer, and it may be 60° C. to 100° C.

There will be described step (d).

In this step (d), as shown in FIG. 5(d) (or FIG. 6(d)), the laminate obtained in step (c) is heated to provide a laminated board.

This step can eliminate most of low-pressure voids or substantially vacuum voids remaining after bonding of the first and the second prepreg with a carrier in step (d), to provide a laminated board having few or substantially no unfilled parts. Thus, a laminated board exhibiting excellent insulation reliability can be obtained.

During the heating, substantially no pressure is applied to the laminate of the first and the second prepregs with a carrier.

Thus, unevenness of the resin is avoided, giving a laminated board with excellent thickness precision.

It is believed that the limit of a thickness of an insulating resin layer in a laminated board with both sides being metalized is 60 μm in a conventional batch press, and such a level cannot meet the recent needs for a thinner laminated board with both sides being metalized. If the thickness of an insulator layer is less than 60 μm in batch press, the base material tends to be directly in contact with the metal foils on both surfaces and reliability in insulation is reduced.

In contrast, according to the method of this embodiment, a laminated board exhibits good thickness precision even when a laminated board with a thickness of less than 60 μm is prepared, resulting in improvement in insulation reliability and in a product yield.

The heating may be conducted, for example, using an apparatus including, but not limited to, a hot air oven, an infrared heater, a heating roller and a flat hot-platen press.

When a hot air oven or infrared heater is used, heating can be conducted substantially without applying a pressure to the laminate.

When a heating roller or flat hot-platen press is used, heating can be conducted with applying a predetermined pressure to the laminate.

Among these, heating is preferably conducted substantially without applying a pressure to the laminate. According to this method, the resin components do not excessively flow in step (d), so that a laminated board having a desirable and highly even insulating-layer thickness can be efficiently prepared.

As the resin components flow, a stress to the fiber cloth base material can be minimized, resulting in a very small internal strain.

Furthermore, a pressure is not substantially applied when the resin components are heated, so that defective dents can be substantially eliminate in this step.

In this embodiment, it is preferable that the laminated prepared in step (e) is carried out under an ambient pressure and is heated continuously under an ambient pressure. Thus, spaces in a glass cloth are filled with a molten resin and then the product is molded under atmospheric pressure, so that while void formation is effectively prevented, a laminate exhibiting further excellent insulation reliability can be manufactured.

A heating temperature may be 60° C. or more and 200° C. or less, preferably 150° C. or more and 200° C. or less. Thus, flowability of an insulating resin is improved and a curing reaction of the insulating resin adequately proceeds, so that void formation can be more effectively prevented.

There are no particular restrictions to heating time which may vary depending on, for example, the type of an insulating resin used; for example, 10 to 20 min.

According to the method for manufacturing a laminated board of this embodiment consisting of steps (a) to (d) as described above, the insulating resin layers of the first and the second long-strip prepregs with a carrier are bonded under reduced pressure with heating, so that voids can be effectively eliminated in an interface between the insulating resin layers and thus few unfilled parts are present. A laminated board exhibiting excellent insulation reliability can be, therefore, manufactured in an improved yield of the product.

Furthermore, since a pair of laminate rolls are used for bonding the insulating resin layers of the first and the second prepregs with a carrier, resulting in improved efficiency in laminate production.

Furthermore, since this embodiment employs a two-side prepreg with a carrier exhibiting good impregnation property and thickness precision, a laminated board exhibiting excellent thickness precision and insulation reliability can be easily manufactured.

A laminated board prepared by the manufacturing method of this embodiment can be suitably used for manufacturing a multilayer printed wiring board which is required to be highly integrated and highly multilayered.

There will be described the method for manufacturing a laminated board in this embodiment with reference to FIGS. 5(a) to (d) and FIGS. 6(a) to (d).

In FIGS. 5(a) to (d), a width-directional dimension of a fiber cloth in a first two-side prepreg 30 with a carrier and a second two-side prepreg 30 with a carrier is smaller than a width-directional dimension of an insulating resin layer. FIG. 5(a) shows relationship in a width-directional dimension for the first and the second two-side prepregs 30,30 with a carrier. As shown in FIG. 5(b), in the first prepreg 30a with a carrier and the second prepreg 30b with a carrier, the carrier in one side is removed and they are disposed such that the exposed insulating resin layers face each other.

In this configuration, in step (c), the insulating resin layer of the first prepreg with a carrier and the insulating resin layer of the second prepreg with a carrier, respectively, may be laminated in the inner region of the first prepreg with a carrier in a width direction, that is, a region where the fiber cloth 4 is present in the width direction.

In the outer region of the carrier with an insulating resin layer in the width-directional dimension, that is, a region where the fiber cloth is absent, the insulating resin layer surface in the first prepreg 30a with a carrier and the insulating resin layer surface in the second prepreg 30b with a carrier can be directly bonded. The status is illustrated in FIG. 5(c).

Furthermore, since these bonding are conducted under a reduced pressure, remaining unfilled parts, if present, within the bonded surface between the insulating resin layers of the first and the second prepregs 30a, 30b with a carrier can be made low-pressure voids or substantially vacuum voids, so that in step (f), heating at a predetermined temperature can easily eliminate them. Furthermore, in step (f), new void formation due to the air entering from the periphery in the width direction can be prevented. The status is illustrated in FIG. 5(d).

There will be described the configuration illustrated in FIGS. 6(a) to (d).

In FIG. 6, a width-directional dimension of an insulating resin layer in a first two-side prepreg 30 with a carrier and a second two-side prepreg 30 with a carrier is equal to a width-directional dimension of a fiber cloth 4. FIG. 6(a) shows relationship in a width-directional dimension for each of the carrier, the insulating resin layer and the fiber cloth. As shown in FIG. 6(b), in the first prepreg 30a with a carrier and the second prepreg 30b with a carrier, the carrier in one side is removed and they are disposed such that the exposed insulating resin layers face each other.

In this configuration, in step (c), the insulating resin layer of the first prepreg 30a with a carrier and the insulating resin layer of the second prepreg 30b with a carrier, respectively, may be laminated in the inner region of the prepregs with a carrier in a width-directional dimension, that is, a region where the fiber cloth 4 is present. This status is shown in FIG. 6(c).

In this configuration, it is preferable that after step (d), that is, after the first and the second prepregs with a carrier are laminated, unfilled parts present in the end in a width direction are not communicated with unfilled parts present in an area other than the end in the width direction.

Thus, the unfilled parts present in the area other than the end in the width direction can be made low-pressure voids or substantially vacuum voids because steps (a1) and (c) are conducted under a reduced pressure, and these can be easily eliminated by heating at a temperature within a predetermined temperature range in step (d). In step (d), new void formation due to the air entering from the periphery in the width direction can be restricted to the end in the width direction. This status is illustrated in FIG. 6(d).

Embodiment B2

In a method for manufacturing a laminated board according to Embodiment B2, all of the following steps are continuously repeated.

(a) preparing a first, a second and a third long-strip two-side prepregs with a carrier by laminating a carrier, an insulating resin layer in which a fiber cloth is embedded, and another carrier, (b1) peeling off the carrier in one side of each of the first and the second two-side prepregs with a carrier to prepare the first and the second long-strip prepregs with a carrier in which the insulating resin layer in one side is exposed, (b2) peeling off the carriers in both sides of the third two-side prepreg with a carrier to prepare a long-strip insulating resin member in which the insulating resin layers in both sides are exposed, (c) abutting the insulating resin layer of the first prepreg with a carrier and the insulating resin layer of the insulating resin member as well as the insulating resin layer of the second prepreg with a carrier and the insulating resin layer of the insulating resin member under reduced pressure while pressing the laminate by a pair of laminate rolls to bond the insulating resin layers together, and (d) heating the laminate formed in the preceding step.

In this embodiment, step (a) includes the following steps (a1) and (a2).

(a1) Under reduced pressure, the sides of a fiber cloth are bonded to the insulating resin layer sides in a first and a second long-strip carrier with an insulating resin layer in which the carrier is formed in one side, respectively.

(a2) After the bonding, the laminate is heated at a temperature equal to or higher than a glass transition temperature of an insulating resin component constituting the insulating resin layer to prepare a first, a second and a third long-strip two-side prepregs with a carrier.

In this embodiment, the same steps as those in Embodiment B1 will not be repeated as appropriate. In the following steps, procedures conducted as described in Embodiment B1 will not be repeated as appropriate.

Steps (a1) and (a2) in this embodiment are conducted as described in Embodiment B1, except that a long-strip third two-side prepreg 31' with a carrier whose carriers in both sides are to be peeled is prepared.

Steps (b1) and (b2) in this embodiment are simultaneously conducted. As shown in FIGS. 7(a) and (b) (FIGS. 8(a) and (b)), the carriers in one sides of the first and the second two-side prepregs 31,31 with a carrier are removed to prepare a first and a second prepregs 31a, 31c with a carrier in which an insulating resin layer is exposed in one side. Furthermore, the carriers in both sides of the third two-side prepreg 31' with a carrier are removed to prepare a film-shaped insulating resin member 31b in which an insulating layer is exposed in both sides.

The carrier in the two-side prepreg with a carrier can be removed by, but not limited to, continuously feeding the two-side prepregs with a carrier while a carrier in one side or both sides in each of the two-side prepregs with a carrier is continuously wound.

In step (c), as shown in FIGS. 7(b) and (c) (FIGS. 8(b) and (c)), the insulating resin layer of the first prepreg 31a with a carrier and one side of the film-shaped insulating resin member 31b as well as the insulating resin layer of the second prepreg 31c with a carrier and the other side of the film-shaped insulating resin member 31b are abutted, and the insulating resin layers are bonded by pressing using a pair of laminate rolls.

There will be described step (d).

In step (d), as shown in FIGS. 7(c) and (d) (FIGS. 8(c) and (d)), the laminate obtained in step (c) is heated for sequentially laminating the first prepreg 31a with a carrier, the film-shaped insulating resin member 31b and the second prepreg 31c with a carrier.

This step can eliminate most of low-pressure voids or substantially vacuum voids remaining in the interface between the insulating resin layers in step (c), to provide a laminated board having few or substantially no unfilled parts. Thus, a laminated board exhibiting excellent insulation reliability can be obtained.

During the heating, substantially no pressure is applied to the laminate of the first prepreg 31a with a carrier, the film-shaped insulating resin member 31b and the second prepreg 31c with a carrier.

Thus, unevenness of the resin is avoided, giving a laminated board with excellent thickness precision. Insulation reliability and a product yield are, therefore, improved.

In this embodiment, it is preferable that the laminated prepared in step (c) is carried out under an ambient pressure and being continuously heated under an ambient pressure. Thus, spaces in a glass cloth are filled with a molten resin and then the product is molded under atmospheric pressure, so that while void formation is effectively prevented, a laminate exhibiting further excellent insulation reliability can be continuously manufactured.

A heating temperature may be 60° C. or more and 200° C. or less, preferably 150° C. or more and 200° C. or less. Thus, flowability of an insulating resin is improved and a curing reaction of the insulating resin adequately proceeds, so that void formation can be more effectively prevented.

There are no particular restrictions to heating time which may vary depending on, for example, the type of an insulating resin used; for example, 10 to 20 min.

A method for manufacturing a laminated board in this embodiment will be further described with reference to FIGS. 7(a) to (d) and FIGS. 8(a) to (d).

In FIGS. 7(a) to (d), a width-directional dimension of a fiber cloth in the first two-side prepreg 31 with a carrier, the third two-side prepreg 31' with a carrier and the second prepreg 31 with a carrier is smaller than a width-directional dimension of an insulating resin layer. As shown in FIG. 7(b), in the first prepreg 31 with a carrier and the second two-side prepreg 31 with a carrier, the carrier in one side is removed, to form the first prepreg 31a with a carrier and the second prepreg 31c with a carrier in which the insulating resin layer is exposed. In the third two-side prepreg 31' with a carrier, the carriers in both sides are removed and thus the insulating resin layer is exposed to form a film-shaped insulating resin member 31b. These insulating resin layers are disposed such that they face each other. FIG. 7(a) shows relationship in a width-directional dimension for the first, the second and the third two-side prepregs with a carrier.

In this configuration, in step (c), the insulating resin layers facing each other can be bonded. This status is shown in FIG. 7(c).

Furthermore, since these bonding are conducted under a reduced pressure, remaining unfilled parts, if present, within the bonded surface between the insulating resin layers can be made low-pressure voids or substantially vacuum voids, so that in step (d), heating at a predetermined temperature can easily eliminate them. Furthermore, in step (d), new void formation due to the air entering from the periphery in the width direction can be prevented. The status is illustrated in FIG. 7(d).

There will be described the configuration illustrated in FIGS. 8(a) to (d).

In FIGS. 8(a) to (d), a width-directional dimension of a fiber cloth in the first two-side prepreg 31 with a carrier, the third two-side prepreg 31' with a carrier and the second two-side prepreg 31 with a carrier is equal to a width-directional dimension of an insulating resin layer. As shown in FIG. 8(b), in the first two-side prepreg 31 with a carrier and the second two-side prepreg 31 with a carrier, the carrier in one side is removed, to form the first prepreg 31a with a carrier and the second prepreg 31c with a carrier in which the insulating resin layer is exposed. In the third two-side prepreg 31' with a carrier, the carriers in both sides are removed and thus the insulating resin layer is exposed to form a film-shaped insulating resin member 31b. These insulating resin layers are disposed such that they face each other. FIG. 8(a) shows relationship in a width-directional dimension for the first, the second and the third two-side prepregs with a carrier.

In this configuration, in step (c), the insulating resin layers facing each other can be bonded. This status is shown in FIG. 8(c).

Furthermore, since these bonding are conducted under a reduced pressure, remaining unfilled parts, if present, within the bonded surface between the insulating resin layers can be made low-pressure voids or substantially vacuum voids, so that in step (d), heating at a predetermined temperature can easily eliminate them. Furthermore, in step (d), new void formation due to the air entering from the periphery in the width direction can be prevented. The status is illustrated in FIG. 8(d).

In this embodiment, the aspect illustrated in FIGS. 7 and 8 may have a configuration where a film-shaped insulating resin member 31b in which an insulating resin layer is exposed in both sides is inserted between the first prepreg 31a with a carrier and the second prepreg 31c with a carrier, to form a laminated board in which four or more prepregs with a carrier are laminated.

Embodiment B3

In a method for manufacturing a laminated board according to Embodiment B3, all of the following steps are continuously repeated.

(a) preparing a first and a second long-strip two-side prepregs with a carrier by laminating a carrier, an insulating resin layer in which a fiber cloth is embedded, and another carrier, (b) peeling off the carrier in one side of each of the first and the second two-side prepregs with a carrier to prepare the first and the second long-strip prepregs with a carrier in which the insulating resin layer in one side is exposed, (c) via a fiber cloth abutting the insulating resin layers in the first and the second long-strip prepregs with a carrier under reduced pressure while pressing the laminate by a pair of laminate rolls to bond the insulating resin layers together, and (d) heating the laminate formed in the preceding step.

In this embodiment, the same steps as those in Embodiment B1 or B2 will not be repeated as appropriate. In the following steps, procedures conducted as described in Embodiment B1 will not be repeated as appropriate.

In this embodiment, step (a) includes the following steps (a1) and (a2).

(a1) Under reduced pressure, the sides of a fiber cloth are bonded to the insulating resin layer sides in a first and a second long-strip carrier with an insulating resin layer in which the carrier is formed in one side, respectively.

(a2) After the bonding, the laminate is heated at a temperature equal to or higher than a glass transition temperature of an insulating resin component constituting the insulating resin layer to prepare a first and a second long-strip two-side prepregs with a carrier.

In the first and the second two-side prepregs with a carrier 40,40 used in step (a1) of this embodiment, as shown in FIG. 13(a) (FIG. 14(a)), the insulating resin layer in the side of a carrier peelably formed is twice as thick as the other insulating resin layer. Except this point, step (a1) in Embodiment B1 is conducted in a similar manner. A film thickness can be changed as described above, to ensure that the fiber cloths are separated from each other even when the fiber cloth 4 is impregnated with an insulating resin and the product is cured.

In step (b) of this embodiment, as shown in FIGS. 13(a) and (b) (FIGS. 14(a) and (b)), the carriers in one sides of the first and the second two-side prepregs with a carrier 40,40 are removed to prepare a first and a second prepregs with a carrier 40a, 40b in which an insulating resin layer is exposed in one side.

The carrier in the two-side prepreg with a carrier can be removed by, but not limited to, continuously feeding the two-side prepregs with a carrier while a carrier in one side in each of the two-side prepregs with a carrier is continuously wound.

In step (c), as shown in FIGS. 13(b) and (c) (FIGS. 14(b) and (c)), the insulating resin layer of the first prepreg 40a with a carrier and one side of the fiber cloth 21a as well as the insulating resin layer of the second prepreg 40b with a carrier and the other side of the fiber cloth 21a are abutted, and the insulating resin layers are bonded via a fiber cloth 4 by pressing using a pair of laminate rolls.

The fiber cloth 21a may be, for example, a roll of a long sheet, from which the cloth can be fed by continuous winding off.

There will be described step (d).

In step (d), as shown in FIGS. 13(c) and (d) (FIGS. 14(c) and (d)), the laminated prepared in the above step (c) is heated for impregnating the fiber cloth 21a with an insulating resin and curing it to form a laminated board having three prepreg layers.

Heating in step (d) can eliminate most of low-pressure voids or substantially vacuum voids remaining in the interface between the insulating resin layers in step (c), to provide a laminated board having few or substantially no unfilled parts. Thus, a laminated board exhibiting excellent insulation reliability can be obtained.

During the heating, substantially no pressure is applied to the first prepreg 40a with a carrier and the second prepreg 40b with a carrier laminated via the fiber cloth 21a.

Thus, unevenness of the resin is avoided, giving a laminated board with excellent thickness precision. Insulation reliability and a product yield are, therefore, improved.

In this embodiment, it is preferable that the laminated prepared in step (c) is carried out under an ambient pressure and being continuously heated under an ambient pressure. Thus, spaces in a glass cloth are filled with a molten resin and then the product is molded under atmospheric pressure, so that while void formation is effectively prevented, a laminate exhibiting further excellent insulation reliability can be continuously manufactured.

A heating temperature may be 60° C. or more and 200° C. or less, preferably 150° C. or more and 200° C. or less. Thus, flowability of an insulating resin is improved and a curing reaction of the insulating resin adequately proceeds, so that void formation can be more effectively prevented.

There are no particular restrictions to heating time which may vary depending on, for example, the type of an insulating resin used; for example, 10 to 20 min.

A method for manufacturing a laminated board in this embodiment will be further described with reference to FIGS. 13(a) to (d) and FIGS. 14(a) to (d).

In FIGS. 13(a) to (d), a width-directional dimension of a fiber cloth in the first two-side prepreg 40 with a carrier and the second prepreg 40 with a carrier is smaller than a width-directional dimension of an insulating resin layer. As shown in FIG. 13(b), in the first prepreg 40 with a carrier and the second two-side prepreg 40 with a carrier, the carrier in one side is removed, to form the first prepreg 40a with a carrier and the second prepreg 40b with a carrier in which the insulating resin layer is exposed. These insulating resin layers are disposed such that they face each other via the fiber cloth 21a. FIG. 13(a) shows relationship in a width-directional dimension for the first and the second two-side prepregs with a carrier.

In this configuration, in step (c), the insulating resin layers facing each other can be bonded via the fiber cloth 21a. This status is shown in FIG. 13(c).

Furthermore, since these bonding are conducted under a reduced pressure, remaining unfilled parts, if present, within the bonded surface between the insulating resin layers can be made low-pressure voids or substantially vacuum voids, so that in step (d), heating at a predetermined temperature can easily eliminate them. Furthermore, in step (d), new void formation due to the air entering from the periphery in the width direction can be prevented. The status is illustrated in FIG. 13(d).

There will be described the configuration illustrated in FIGS. 14(a) to (d).

In FIGS. 14(a) to (d), a width-directional dimension of a fiber cloth in the first two-side prepreg 40 with a carrier and the second prepreg 40 with a carrier is equal to a width-directional dimension of an insulating resin layer. As shown in FIG. 14(b), in the first two-side prepreg 40 with a carrier and the second two-side prepreg 40 with a carrier, the carrier in one side is removed, to form the first prepreg 40a with a carrier and the second prepreg 40b with a carrier in which the insulating resin layer in one side is exposed. These insulating resin layers are disposed such that they face each other via the fiber cloth 21a. FIG. 14(a) shows relationship in a width-directional dimension for the first and the second two-side prepregs 40,40 with a carrier and the fiber cloth 21a.

In this configuration, in step (c), the insulating resin layers facing each other via the fiber cloth 21a can be bonded. This status is shown in FIG. 14(c).

Furthermore, since these bonding are conducted under a reduced pressure, remaining unfilled parts, if present, within the bonded surface between the insulating resin layers can be made low-pressure voids or substantially vacuum voids, so that in step (d), heating at a predetermined temperature can easily eliminate them. Furthermore, in step (d), new void formation due to the air entering from the periphery in the width direction can be prevented. The status is illustrated in FIG. 14(d).

Figure 13:
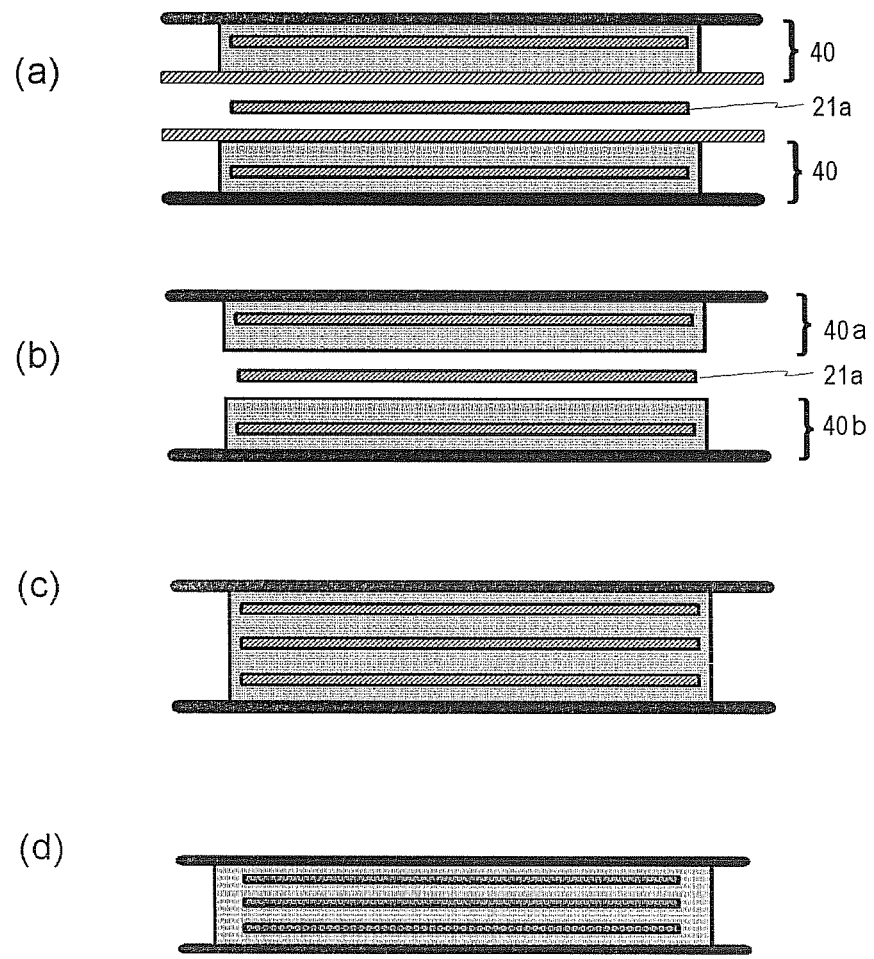
FIG. 13 is a schematic cross-sectional process chart illustrating an example of manufacturing a laminated board using a couple of two-side prepregs with a carrier and a fiber cloth in the manufacturing method of this embodiment.
Figure 14:
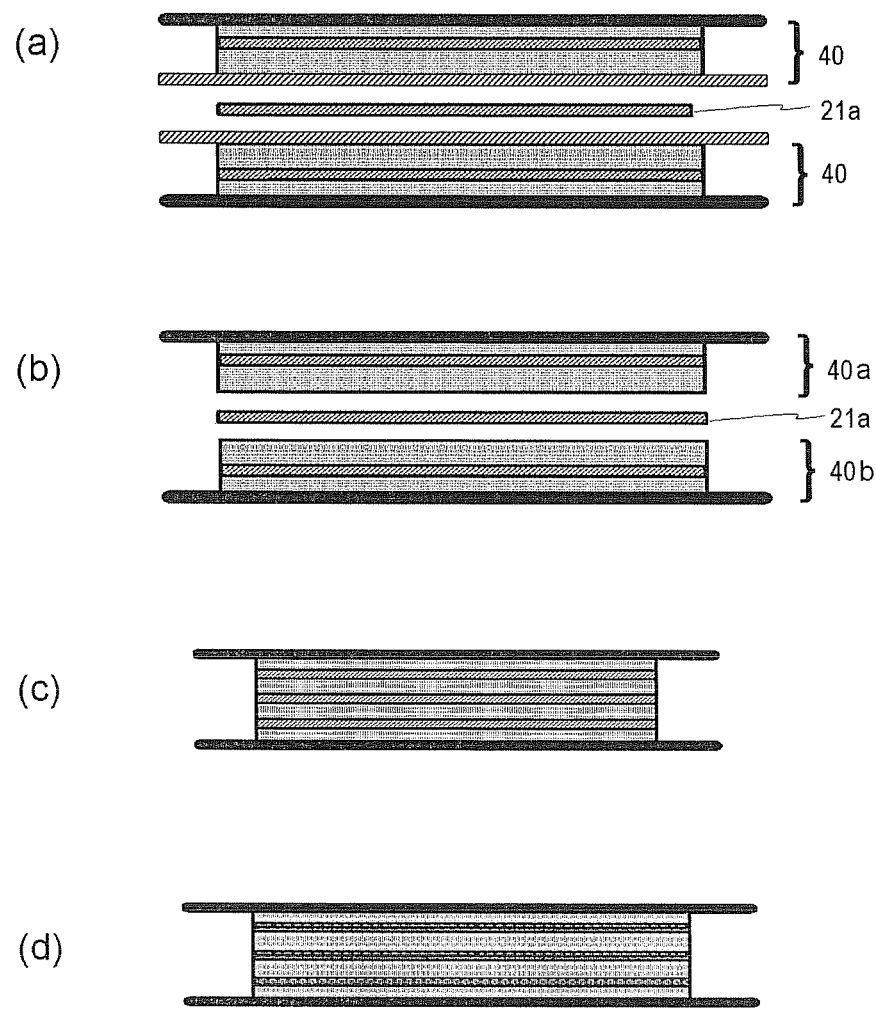
FIG. 14 is a schematic cross-sectional process chart illustrating another example of manufacturing a laminated board using a couple of two-side prepregs with a carrier and a fiber cloth in the manufacturing method of this embodiment.

In this embodiment, the aspect illustrated in FIGS. 13 and 14 may have a configuration where a film-shaped insulating resin member in which an insulating resin layer is exposed in both sides is appropriately disposed, to form a laminated board having four or more prepregs with a carrier.

In the method for manufacturing a laminated board of this embodiment, the configurations shown in FIGS. 2(a) to (c), FIGS. 3(a) to (c), FIGS. 5(a) to (d), FIGS. 7(a) to (d) and FIGS. 13(a) to (d) are preferable among the above configurations. In other words, the first prepreg with a carrier and the second prepreg with a carrier are preferably those in which a carrier has a width-directional dimension larger than that of the fiber cloth or the insulating resin layer and the insulating resin layers of these has a width-directional dimension larger than that of these fiber cloths.

Thus, in steps (a2) and (d), the fiber cloth can be sealed with the insulating resin layer, and there can be provided a laminated board having few or substantially no voids in the whole region where the fiber cloth is present.

In particular, a prepreg with a carrier used in the present method for manufacturing a laminated board preferably has the configuration illustrated in FIGS. 2(a) to (c), that is, a prepreg where the carrier has a width-directional dimension larger than that of the fiber cloth 4 and the insulating resin layer has a width-directional dimension larger than that of the fiber cloth 4 in the first carrier 3a with an insulating resin layer and the second carrier 3a' with an insulating resin layer.

In this configuration, the insulating resin layers of the first and the second carriers with an insulating resin layer are bonded in both sides in a width direction of the fiber cloth 4, so that the fiber cloth 4 can be more easily sealed by the insulating resin layer and thus the above effects can be more effectively achieved.

In terms of a prepreg with a carrier used in a method for manufacturing a laminated board of this embodiment, there is preferably a step of continuously winding the above prepreg with a carrier prepared after step (b).

Thus, the prepreg with a carrier may be a roll, which can be used for improving workability of steps (b) to (d).

In terms of a laminated board of this embodiment, there is preferably the step of continuously winding a laminated board having the above prepreg with a carrier formed or of cutting the laminated board into a predetermined dimension in a feeding direction at a carrying outlet after step (d).

Thus, a laminated board having a prepreg with a carrier can be in a predetermined shape and efficient production can be effectively achieved.

Manufacturing Apparatus

Apparatus Used in the Manufacturing Method of Embodiment B1

Figure 15:
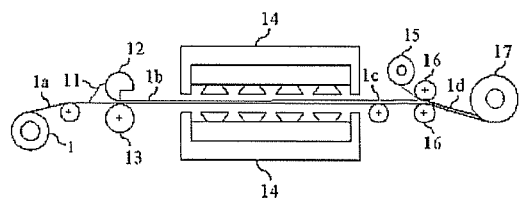
FIG. 15($a$) is a schematic cross-sectional side view illustrating an example of an apparatus for manufacturing a carrier with an insulating resin layer used in the manufacturing process of this embodiment, and FIG. 15($b$) is a schematic cross-sectional view illustrating an example of an apparatus for manufacturing a two-side prepreg with a carrier or an apparatus for manufacturing a laminate using a couple of two-side prepregs with a carrier and a fiber cloth, used in the manufacturing method of this embodiment.
Figure 15:
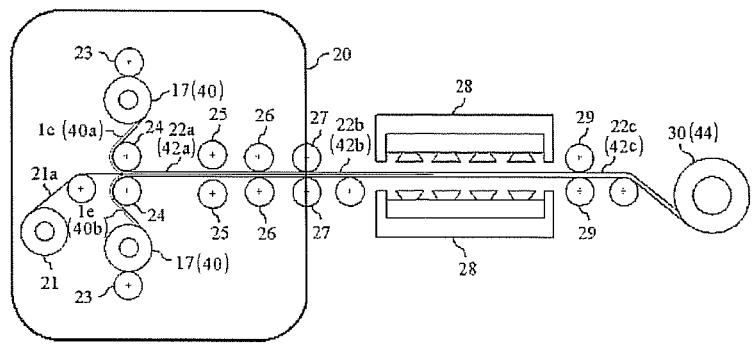
Figure 16:
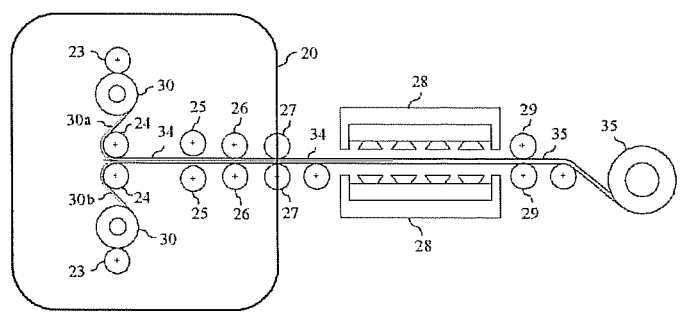
FIG. 16 is a schematic cross-sectional view illustrating an example of an apparatus for manufacturing a laminated board using a couple of two-side prepregs with a carrier.

The method for manufacturing a laminated board of this embodiment can be conducted using a manufacturing apparatus illustrated in FIGS. 15 and 16. In FIGS. 15 and 16, the method is described using cross-sectional views of the manufacturing apparatus.

FIG. 15(a) illustrates an example of an apparatus for manufacturing a carrier with an insulating resin layer used in manufacturing a laminated board having a prepreg with a carrier of this embodiment.

In FIG. 15(a), a carrier is a carrier 1 as, for example, a roll of a long sheet, from which the carrier can be fed by continuous winding off.

A predetermined amount of a liquid insulating resin 11 is fed on a continuously carrier 1a by a feeding machine for the insulating resin (not shown). The coating amount of the insulating resin 11 can be controlled by a clearance between a comma roll 12 and a backup roll 13 of the comma roll 12.

A carrier 1b coated with a predetermined amount of the insulating resin is carried in transverse conveying type hot air dryers 14, 14 for substantially removing, for example, an organic solvent contained in the liquid insulating resin, and, if necessary, may be made into a carrier 1c with an insulating resin layer in which a curing reaction partly proceeds. The carrier 1c with an insulating resin layer may be wound up as it is, but in the configuration of FIG. 15(a), its side in which the insulating resin layer is formed is laminated with a protective film 15 by laminate rolls 16, 16 to form a carrier 1d with an insulating resin layer in which the protective film 15 is laminated, and the product is wound up to give a carrier 17 with an insulating resin layer as a roll.

FIG. 15(b) is a cross-sectional view illustrating an example of an apparatus by which step (a) in the manufacturing method of this embodiment can be conducted. Specifically, both sides of the fiber cloth are laminated with the insulating resin layer sides of the carriers with an insulating resin layer, and they can be bonded under reduced pressure, then heated at a temperature equal to or higher than a glass transition temperature of the insulating resin and continuously wound up to prepare a prepreg with a carrier.

In FIG. 15(b), step (a) is conducted using a vacuum laminator 20.

The inside of the vacuum laminator 20 is under the predetermined vacuum conditions by a pressure reducing device such as a vacuum pump (not shown).

Within the vacuum laminator 20, the carriers 17, 17 with an insulating resin layer obtained by the apparatus in FIG. 15 and a fiber cloth 21 are disposed such that they can be continuously fed.

The carriers 17, 17 with an insulating resin layer has the above protective film which is laminated on the surface of the insulating resin layer, and are, therefore, continuously fed as a first and a second carriers with an insulating resin layer 1e, 1e while the protective film is peeled off by the wind-up rolls 23, 23. The fiber cloth 21a is continuously fed from the roll type fiber cloth 21.

The first and the second carriers with an insulating resin layer 1e, 1e from which the protective film has been peeled off and a fiber cloth 21a are abutted such that the fiber cloth 21a is sandwiched by the insulating resin layers of the carriers with an insulating resin layer 1e, 1e, and they are bonded by pressing by the laminate rolls 24, 24.

A clearance between the laminate rolls 24, 24 can be adjusted such that substantially no pressure is applied or a given pressure is applied, in bonding the carriers with an insulating resin layer and the fiber cloth.

The bonding product 22a after the bonding may be fed to the next step as it is, or heated and compressed by the laminate rolls (25, 25), (26, 26) and (27, 27) for adjusting a bonding degree of the carrier with an insulating resin layer with the fiber cloth. In this embodiment, the system is preferably adapted such that a laminate pressure is applied from the carrier side by one of the laminate roll pairs in the light of preventing bubbles from being entrained in the bonding interface.

In FIG. 15(b), the laminate rolls 27, 27 also act as seal rolls for preventing air from entering the inside of the vacuum laminator 20 from the outside in order to maintain the predetermined vacuum conditions in the vacuum laminator 20.

After the bonding, the bonding product 22b is carried between the transverse conveying type hot air dryers 28, 28 while being heated at a temperature equal to or higher than a glass transition temperature of the insulating resin. Thus, unfilled parts remaining within the bonding product can be eliminated.

The prepreg 22c with a carrier after the heating can be continuously wounded up while being sandwiched by pinch rolls 29, 29, to provide a roll type prepreg 30 with a carrier.

FIG. 16 is a side cross-sectional view illustrating an apparatus by which steps (b) to (d) in the manufacturing method of Embodiment B1 can be conducted. Steps (b) and (c) can be conducted using the vacuum laminator 20.

The inside of the vacuum laminator 20 is under the predetermined vacuum conditions by a pressure reducing device such as a vacuum pump (not shown).

Within the vacuum laminator 20, the prepregs 30a, 30b with a carrier obtained in step (a1) are disposed such that each of them can be continuously fed.

The prepregs 30a, 30b with a carrier are continuously fed while the carrier in one side of the two-side prepregs 30 with a carrier in which the carrier is laminated on the surface of the insulating resin layer is peeled off by wind-up rolls 23, 23. The prepregs 30a, 30b with a carrier in which the carrier has been peeled off are carried along the periphery of a pair of laminate rolls 24, 24 while the insulating resin layers are abutted each other, and bonded by pressing by the laminate rolls 24, 24 from the carrier side.

A clearance between the laminate rolls 24, 24 can be adjusted such that substantially no pressure is applied or a given pressure is applied, in bonding the carriers with an insulating resin layer and the fiber cloth.

The bonding product 34 after the bonding may be fed to the next step as it is, or heated and compressed by the laminate rolls (25, 25), (26, 26) and (27, 27) for adjusting a bonding degree of the insulating resin layer sides of the prepregs with a carrier. In this embodiment, the system is preferably adapted such that a laminate pressure is applied from the carrier side by one of the laminate roll pairs in the light of preventing bubbles from being entrained in the bonding interface.

In FIG. 16, the laminate rolls 27, 27 also act as seal rolls for preventing air from entering the inside of the vacuum laminator 20 from the outside in order to maintain the predetermined vacuum conditions in the vacuum laminator 20.

After the bonding, the bonding product 34 is carried between the transverse conveying type hot air dryers 28, 28 while being heated at a temperature within a predetermined range. Thus, unfilled parts remaining within the bonding product can be eliminated.

The laminated board 35 after the heating can be continuously wounded up while being sandwiched by pinch rolls 29, 29, to provide a roll type laminated board 35.

The laminated board of Embodiment B3 can be also manufactured using the manufacturing apparatus of FIG. 15.

Apparatus Used in the Manufacturing Method of Embodiment B2

In Embodiment B2, a carrier with an insulating resin layer is prepared using the manufacturing apparatus in FIG. 15(a) as described in Embodiment B1. Furthermore, as described in Embodiment B1, step (a) of the manufacturing method of this embodiment can be conducted using the manufacturing apparatus in FIG. 15(b). Thus, a first and a second long-strip two-side prepregs with a carrier can be prepared.

Figure 17:
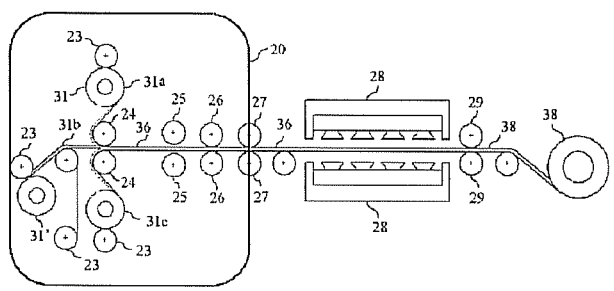
FIG. 17 is a schematic cross-sectional view illustrating an example of an apparatus for manufacturing a laminated board using three two-side prepregs with a carrier.

FIG. 17 is a cross-sectional view illustrating an example of an apparatus by which steps (b) to (d) in the manufacturing method of Embodiment B2 can be conducted. Steps (b) and (c) are conducted using a vacuum laminator 20. In FIG. 17, equivalent elements are denoted by similar symbols, for which description will not be repeated as appropriate.

Within the vacuum laminator 20, the prepreg 31a with a carrier, the insulating resin member 31b and the prepreg 31c with a carrier obtained in step (b) are disposed such that each of them can be continuously fed.

The prepregs 31a, 31c with a carrier are continuously fed while the carrier in one side is peeled off from each of the two-side prepregs 31,31 with a carrier by a wind-up roll 23. The insulating resin member 31b is continuously fed while the carriers in both sides are peeled off from the two-side prepreg 31' with a carrier by wind-up rolls 23, 23.

Since four carriers are peeled off in the vacuum laminator 20 in the manufacturing apparatus shown in FIG. 17, resin fragments and dusts may generate during the method. For facilitating peeling of the carrier and preventing resin fragments and so on from generating, a slit can be placed in advance in an interface between the carrier to be peeled and the insulating resin.

The prepregs 31a, 31c with a carrier in which the carrier in one side has been peeled off are carried along the periphery of the laminate rolls 24, 24. On the other hand, the insulating resin member 31b in which the carriers in both sides have been peeled off is fed between the prepregs 31a, 31c with a carrier. Between a pair of laminate rolls 24, 24, the insulating resin layers are abutted each other and pressed from the carrier side to be bonded.

The bonding product 36 after the bonding may be fed to the next step as it is, or heated and compressed by the laminate rolls (25, 25), (26, 26) and (27, 27) for adjusting a bonding degree of the insulating resin layer sides of the prepregs with a carrier. In this embodiment, the system is adapted such that a laminate pressure is applied from the carrier side by one of the laminate roll pairs in the light of preventing bubbles from being entrained in the bonding interface.

After the bonding, the bonding product 36 is carried between the transverse conveying type hot air dryers 28, 28 while being heated at a temperature within a predetermined range. Thus, unfilled parts remaining within the laminate can be eliminated.

The laminate 36 after the heating can be continuously wounded up while being sandwiched by pinch rolls 29, 29, to provide a roll type laminated board 38.

In this embodiment, when a laminated board is manufactured using four or more prepregs with a carrier, there may be an additional apparatus for removing both carriers from the two-side prepreg with a carrier and continuously feeding it.

Apparatus Used in the Manufacturing Method of Embodiment B3

In Embodiment B3, a carrier with an insulating resin layer is prepared using the manufacturing apparatus in FIG. 15(a) as described in Embodiment B1. Furthermore, as described in Embodiment B1, step (a) of the manufacturing method of this embodiment can be conducted using the manufacturing apparatus in FIG. 15(b). Thus, a first and a second long-strip two-side prepregs with a carrier can be prepared.

An apparatus by which steps (b) to (d) in the manufacturing method of Embodiment B3 may be that illustrated in FIG. 15(b).

In FIG. 15(b), steps (b) and (c) are conducted using a vacuum laminator 20.

The inside of the vacuum laminator 20 is under the predetermined vacuum conditions by a pressure reducing device such as a vacuum pump (not shown).

Within the vacuum laminator 20, the first and the second two-side prepregs with a carrier 40,40 obtained by step (a) and a fiber cloth 21 are disposed such that they can be continuously fed.

The first and the second two-side prepregs with a carrier 40,40 have the carrier which is laminated on the surface of the insulating resin layer, and are, therefore, continuously fed as a first and a second prepregs with a carrier 40a, 40b while the carrier is peeled off by the wind-up rolls 23, 23. The fiber cloth 21a is continuously fed from the roll type fiber cloth 21.

The first and the second prepregs with a carrier 40a, 40b from which the carrier has been peeled off and a fiber cloth 21a are abutted such that the fiber cloth 21a is sandwiched by the insulating resin layers of the first and the second prepregs with a carrier 40a, 40b, and they are bonded by pressing by the laminate rolls 24, 24.

A clearance between the laminate rolls 24, 24 can be adjusted such that substantially no pressure is applied or a given pressure is applied, in bonding the prepreg with a carrier and the fiber cloth. In this embodiment, the system is adapted such that a laminate pressure is applied from the carrier side by one of the laminate roll pairs in the light of preventing bubbles from being entrained in the bonding interface.

The laminate 42a after the bonding may be fed to the next step as it is, or heated and compressed by the laminate rolls (25, 25), (26, 26) and (27, 27) for adjusting a bonding degree of the carrier with an insulating resin layer with the fiber cloth.

In FIG. 15(b), the laminate rolls 27, 27 also act as seal rolls for preventing air from entering the inside of the vacuum laminator 20 from the outside in order to maintain the predetermined vacuum conditions in the vacuum laminator 20.

After the bonding, the laminate 42b is carried between the transverse conveying type hot air dryers 28, 28 while being heated at a predetermined temperature. Thus, unfilled parts remaining within the laminate can be eliminated.

The laminated board 42c after the heating can be continuously wounded up while being sandwiched by pinch rolls 29, 29, to provide a laminated board 44.

In this embodiment, when a laminated board having four or more prepregs is manufactured, there may be an additional apparatus for removing both carriers from the two-side prepreg with a carrier as shown in FIG. 17 and continuously feeding it.

There will be described a laminated board prepared using the prepreg with a carrier of this embodiment.

The laminated board having the prepreg with a carrier of this embodiment is characterized in that it is manufactured by a method for manufacturing the prepreg with a carrier of this embodiment.

In the metal foil in the laminated board having the prepreg with a carrier obtained in this embodiment can be etched to form a desired conductor circuit.

As described above, according to the manufacturing method of this embodiment there is provided a method for continuously manufacturing a laminated board using a prepreg with a carrier having an insulating resin layer including a backbone material of a fiber cloth, and this method can easily manufacture a laminated board with good impregnation properties and thickness precision which exhibits excellent connection reliability. In particular, when a thin fiber cloth is used, it can provide a laminated board with less internal strain and good impregnation properties.

Furthermore, a laminated board prepared using a prepreg with a carrier of the present invention exhibits excellent mechanical properties such as warpage and dimension stability as well as moldability, and can be suitably used for an application such as a printed wiring board required to be highly integrated and multilayered, which must be highly reliable.

EXAMPLES

The present invention will be described with reference to, but not limited to, Examples and Comparative Examples.

Example A

1. Preparation of a Liquid Resin Composition for Forming an Insulating Resin Layer A resin varnish was prepared by dissolving 100 parts by weight of an epoxy resin (Japan Epoxy Resins Co., Ltd., "Ep5048"), 2 parts by weight of a curing agent (dicyandiamide) and 0.1 parts by weight of a hardening accelerator (2-ethyl-4-methylimidazole) as resin components in 100 parts by weight of methyl cellosolve.

2. Preparation of a Carrier with an Insulating Resin Layer (1) Preparation of a Carrier A with an Insulating Resin Layer A polyethylene terephthalate film with a thickness of 35 µm and a width of 480 mm was used as a carrier.

Using the apparatus having the configuration illustrated in FIG. 10(a), a carrier was coated with the liquid resin composition by a comma coater and dried in an oven at 170° C. for 3 min, to prepare an insulating resin layer with a thickness of 30 µm and a width of 410 mm which was in the center of the carrier in a width direction.

A protective film (polyethylene) was laminated on the side of this insulating resin layer to prepare a carrier with an insulating resin layer.

(2) Preparation of a Carrier B with an Insulating Resin Layer

A carrier used was as described above.

Using the apparatus having the configuration illustrated in FIG. 10(a), a carrier was coated with the liquid resin composition by a comma coater and dried in an oven at 170° C. for 3 min, to prepare an insulating resin layer with a thickness of 30 μm and a width of 360 mm which was in the center of the carrier in a width direction.

A protective film (polyethylene) was laminated on the side of this insulating resin layer to prepare a carrier with an insulating resin layer.

(3) Preparation of a Carrier C with an Insulating Resin Layer

A carrier was a copper foil film with a thickness of 12 μm and a width of 480 mm.

Using the apparatus having the configuration illustrated in FIG. 10(*a*), a carrier was coated with the liquid resin composition by a comma coater and dried in an oven at 170° C. for 3 min, to prepare an insulating resin layer with a thickness of 30 μm and a width of 410 mm which was in the center of the carrier in a width direction.

A protective film (polyethylene) was laminated on the side of this insulating resin layer to prepare a carrier with an insulating resin layer.

(4) Preparation of a Carrier D with an Insulating Resin Layer

A carrier was a copper foil film with a thickness of 12 μm and a width of 480 mm.

Using the apparatus having the configuration illustrated in FIG. 10(*a*), a carrier was coated with the liquid resin composition by a comma coater and dried in an oven at 170° C. for 3 min, to prepare an insulating resin layer with a thickness of 30 μm and a width of 360 mm which was in the center of the carrier in a width direction.

A protective film (polyethylene) was laminated on the side of this insulating resin layer to prepare a carrier with an insulating resin layer.

3. Preparation of a Two-Side Prepreg with a Carrier (1) Preparation of a Two-Side Prepreg E(1) with a Carrier A fiber cloth was a glass fabric (Unitika Glass Fiber Co., Ltd., "E10T-SK", width: 360 mm, grammage: 104 g/m$^2$).

The carriers with an insulating resin layer A and C prepared above were used as a first and a second carriers with an insulating resin layer, respectively.

Using the apparatus having the configuration illustrated in FIG. 10(*b*), the protective films in the first and the second carriers with an insulating resin layer were peeled off while the sides of the fiber cloth were laminated with the respective insulating resin layer sides of the carriers with an insulating resin layer such that the fiber cloth was in the center of the carrier in a width direction, and these were bonded using laminate rolls (24) at 60° C. under the condition of a vacuum degree of 10 Torr.

Here, in the inner region of the carrier with an insulating resin layer in the width direction, the insulating resin layer sides of the first and the second carriers with an insulating resin layer were bonded to both sides of the fiber cloth, and in the outer region of the fiber cloth in the width direction, the insulating resin layers of the first and the second carriers with an insulating resin layer were bonded to each other.

Then, the bonded product prepared as described above was heated by passing it through a transverse-conveying hot air oven maintained at 120° C. over 2 min for melting the insulating resin layers without applying any pressure, to prepare a two-side prepreg E(1) with a carrier.

(2) Preparation of a Two-Side Prepreg E(2) with a Carrier

A fiber cloth was as described above.

The carriers with an insulating resin layer A and D prepared above were used as a first and a second carriers with an insulating resin layer, respectively.

Using the apparatus having the configuration illustrated in FIG. 10(*b*), the protective films in the first and the second carriers with an insulating resin layer were peeled off while the sides of the fiber cloth were laminated with the respective insulating resin layer sides of the carriers with an insulating resin layer such that the fiber cloth was in the center of the carrier in a width direction, and these were bonded using laminate rolls (24) at 80° C. under the condition of a vacuum degree of 10 Torr.

Here, in the inner region of the carrier with an insulating resin layer in the width direction, the insulating resin layer sides of the first and the second carriers with an insulating resin layer were bonded to both sides of the fiber cloth, and in the outer region of the fiber cloth in the width direction, the insulating resin layer of the first carrier with an insulating resin layer was bonded to the carrier of the second carrier with an insulating resin layer.

Then, the bonded product prepared as described above was heated by passing it through a transverse-conveying hot air oven maintained at 120° C. over 2 min for melting the insulating resin layers without applying any pressure, to prepare a two-side prepreg E(2) with a carrier.

(3) Preparation of a Two-Side Prepreg E(3) with a Carrier

A fiber cloth was as described above.

The carriers with an insulating resin layer B and C prepared were used as a first and a second carriers with an insulating resin layer, respectively.

Using the apparatus having the configuration illustrated in FIG. 10(*b*), the protective films in the first and the second carriers with an insulating resin layer were peeled off while the sides of the fiber cloth were laminated with the respective insulating resin layer sides of the carriers with an insulating resin layer such that the fiber cloth was in the center of the carrier in a width direction, and these were bonded using laminate rolls (24) at 80° C. under the condition of a vacuum degree of 10 Torr.

Here, in the inner region of the carrier with an insulating resin layer in the width direction, the insulating resin layer sides of the first and the second carriers with an insulating resin layer were bonded to both sides of the fiber cloth, and in the outer region of the fiber cloth in the width direction, the resin layer of the first carrier with an insulating resin layer was bonded to the resin layer of the second carrier with an insulating resin layer.

Then, the bonded product prepared as described above was heated by passing it through a transverse-conveying hot air oven maintained at 120° C. over 2 min for melting the insulating resin layers without applying any pressure, to prepare a two-side prepreg E(3) with a carrier.

(4) Preparation of a Two-Side Prepreg F with a Carrier

A fiber cloth was as described above.

The carriers with an insulating resin layer B and D prepared above were used as a first and a second carriers with an insulating resin layer, respectively.

Using the apparatus having the configuration illustrated in FIG. 10(*b*), the protective films in the first and the second carriers with an insulating resin layer were peeled off while the sides of the fiber cloth were laminated with the respective insulating resin layer sides of the carriers with an insulating resin layer such that the fiber cloth was in the center of the carrier in a width direction, and these were bonded using laminate rolls (24) at 80° C. under the condition of a vacuum degree of 10 Torr.

Here, in the inner region of the carrier with an insulating resin layer in the width direction, the insulating resin layer sides of the first and the second carriers with an insulating resin layer were bonded to both sides of the fiber cloth.

Then, the bonded product prepared as described above was heated by passing it through a transverse-conveying hot air oven maintained at 120° C. over 2 min for melting the insulating resin layers without applying any pressure, to prepare a two-side prepreg F with a carrier.

4. Preparation of a Laminated Board Having a Two-Side Prepreg with a Carrier Example A1

As a two-side prepreg with a carrier, a couple of the two-side prepregs E(1) with a carrier prepared above which had been wound up as two rolls were prepared and used as a first and a second two-side prepregs with a carrier.

Using the apparatus having the configuration illustrated in FIG. 11, the polyethylene terephthalate films in the first and the second two-side prepregs with a carrier were peeled off while being laminated with the exposed sides of the insulating resin layer of the first and the second prepregs with a carrier such that the fiber cloth was in the center of the carrier in a width direction, and the insulating resin layers were bonded using laminate rolls (24) at 60° C. under the condition of a vacuum degree of 10 Torr.

Here, in the inner region of the prepregs with a carrier in the width direction, the insulating resin layer sides of the first and the second prepregs with a carrier were bonded, and in both outer regions of the prepregs with a carrier in the width direction, the insulating resin layers of the first and the second prepregs with a carrier were bonded.

Then, the bonded product prepared as described above was heated by passing it through a transverse-conveying hot air oven maintained at 200° C. over 10 min for melting the insulating resin layers without applying any pressure, to prepare a laminated board having a prepreg with a carrier.

Example A2

As a two-side prepreg with a carrier, the two-side prepreg E(1) with a carrier and the two-side prepreg F with a carrier prepared above were used as a first and a second two-side prepregs with a carrier.

Using the apparatus having the configuration illustrated in FIG. 11, the polyethylene terephthalate films in the first and the second two-side prepregs with a carrier were peeled off while being laminated with the exposed sides of the insulating resin layer of the first and the second prepregs with a carrier such that the fiber cloth was in the center of the carrier in a width direction, and the insulating resin layers were bonded using laminate rolls (24) at 60° C. under the condition of a vacuum degree of 10 Torr.

Here, in the inner region of the prepregs with a carrier in the width direction, the insulating resin layer sides of the first and the second prepregs with a carrier were bonded, and in the outer region of the prepregs with a carrier in the width direction, the insulating resin layers of the first and the second prepregs with a carrier were bonded.

Then, the bonded product prepared as described above was heated by passing it through a transverse-conveying hot air oven maintained at 200° C. over 10 min for melting the insulating resin layers without applying any pressure, to prepare a laminated board having a prepreg with a carrier.

Example A3

As a two-side prepreg with a carrier, the two-side prepreg F with a carrier prepared above was used as a first and a second two-side prepregs with a carrier.

Using the apparatus having the configuration illustrated in FIG. 11, the polyethylene terephthalate films in the first and the second two-side prepregs with a carrier were peeled off while being laminated with the exposed sides of the insulating resin layer of the first and the second prepregs with a carrier such that the fiber cloth was in the center of the carrier in a width direction, and the insulating resin layers were bonded using laminate rolls (24) at 80° C. under the condition of a vacuum degree of 10 Torr.

Here, in the inner region of the prepregs with a carrier in the width direction, the insulating resin layer sides of the first and the second prepregs with a carrier were bonded, and in the outer region of the prepregs with a carrier in the width direction, the insulating resin layers of the first and the second prepregs with a carrier were bonded.

Then, the bonded product prepared as described above was heated by passing it through a transverse-conveying hot air oven maintained at 200° C. over 10 min for melting the insulating resin layers without applying any pressure, to prepare a laminated board having a prepreg with a carrier.

Comparative Example A1

A glass fabric (thickness: 94 μm, Nitto Boseki Co., Ltd., WEA-2116) was impregnated with a resin varnish as described in Examples, and dried in an oven at 150° C. for 2 min to prepare a long prepreg with a solid varnish content of about 50% by weight. This long prepreg was cut into square prepregs, 500 mm on a side. A copper foil film with a thickness of 12 μm and a width of 480 mm was cut into squares, 500 mm on a side, which was used as a carrier. After two prepregs were laminated, the laminate was sandwiched between the carriers, and the resulting laminate was pressed under a pressure of 4 MPa by a pair of hot platens with heating at 200° C. for 2 hours, to prepare a double-sided copper-clad laminated body with a thickness of 0.2 mm.

5. Evaluation

The laminated boards prepared using the two-side prepregs with a carrier prepared in Examples and Comparative Example were evaluated for their properties. The results are shown in Table 1.

TABLE 1

| | | Thickness precision | |
|---|---|---|---|
| | Impregnation property | Average (μm) | Deviation (μm) |
| Example A1 | No permeation of a penetrant from the end to the center and no swelling | 220 | 1.2 |
| Example A2 | No permeation of a penetrant from the end to the center and no swelling | 219 | 1.5 |
| Example A3 | No permeation of a penetrant from the end to the center and no swelling | 220 | 0.8 |
| Comparative Example A1 | No permeation of a penetrant from the end to the center and no swelling | 227 | 2.4 |

The above results demonstrate that the laminated boards of Examples A1 to A3 exhibit higher thickness precision than Comparative Example A1. The results for impregnation properties demonstrate their improved insulation reliability. Furthermore, the results in Table 1 show that a laminated board exhibiting excellent thickness precision and insulation reliability can be provided when three or more two-side prepregs with a carrier are used for manufacturing a laminated board.

Similar results were obtained substituting the two-side prepregs with a carrier E(2) or E(3) for the two-side prepreg E(1) with a carrier in Examples A1 to A2.

Evaluation methods are as follows.

(1) Impregnation Properties

A laminated board having a prepreg with a carrier prepared in one of Examples was immersed in a fluorescent penetrant, and the presence of permeation by the fluorescent penetrant was checked by a microscope.

In addition, a laminated board having a prepreg with a carrier was treated with PCT (121° C./100%/120 min), and then immersed in a solder bath at 260° C. for 30 sec and then presence of swelling was checked.

(2) Thickness Precision

A cross section of a laminated board having a prepreg with a carrier in one of Examples was observed by a microscope to determine a thickness at three points at a pitch of 100 mm in a width direction, from which an average and a standard deviation were calculated.

Example B

1. Preparation of a Liquid Resin Composition for Forming an Insulating Resin Layer (1) Preparation of a Resin Varnish A A resin varnish was prepared by dissolving 100 parts by weight of an epoxy resin (Japan Epoxy Resins Co., Ltd., "Ep5048"), 2 parts by weight of a curing agent (dicyandiamide) and 0.1 parts by weight of a hardening accelerator (2-ethyl-4-methylimidazole) as resin components in 100 parts by weight of methyl cellosolve.

(2) Preparation of a Resin Varnish B

A resin varnish B was prepared using 30% by weight of a solid novolac type epoxy resin (epoxy equivalent: 190), 15% by weight of a liquid bisphenol-A type epoxy resin (epoxy equivalent: 190), 30% by weight of a solid novolac type phenol resin (hydroxyl equivalent: 110), 1% parts by weight of 2-phenyl-4-methyl-5-hydroxy methyl imidazole as a hardening accelerator and 19% of aluminum hydroxide.

(3) Preparation of a Resin Varnish C

In methyl ethyl ketone were dissolved and dispersed 30% by weight of a novolac type cyanate resin (PT-30, Lonza Group Ltd., weight-average molecular weight: 1,300), 10% by weight of a mixed bisphenol-A type and F-type epoxy resin (Epikote 4275, JER, weight-average molecular weight: 57,000), 19.5% by weight of a biphenyl dimethylene type epoxy resin (NC-3000P, Nippon Kayaku Co., Ltd., epoxy equivalent: 275) and 0.5% by weight of an imidazole compound (2-phenyl-4,5-dihydroxymethylimidazole, Shikoku Chemicals Corporation). Then, 40% by weight of a spherical fused silica (SO-25H, ADMATECHS CO., LTD.) was added as an inorganic filler, and the resulting mixture was stirred for 10 min using a high-speed stirrer to prepare a resin varnish C having a resin concentration of 65% by weight.

The spherical fused silica (SO-25H) was preliminarily surface-treated by adding 0.5 parts by weight of an epoxysilane coupling agent (A-187, Nippon Unicar Co., Ltd.) to 100 parts by weight of the spherical fused silica.

(4) Preparation of a Resin Varnish D

In 65 parts by weight of methyl ethyl ketone were dissolved 53.7 parts by weight of a tetrabromobisphenol-A type epoxy resin (epoxy equivalent: 500, Dow Chemical Japan Ltd., Product No.: DER511), 23 parts by weight of a cresol novolac type epoxy resin (epoxy equivalent: 200, Tohto Kasei Co., Ltd., Product No.: YDCN702P), 23.3 parts by weight of a phenol novolac resin (OH equivalent: 105, Arakawa Chemical Industries, Ltd., TAMANOL 752), 3 parts by weight of a phenoxy resin (weight-average molecular weight Mw: 42600, number average molecular weight Mn: 11200, Union Carbide Research Institute, PKHH) and 0.15 parts by weight of a hardening accelerator triphenylphosphine, to prepare a resin varnish D.

2. Preparation of a Long-Strip Carrier with an Insulating Resin Layer (1) Preparation of a Long-Strip Carrier A with an Insulating Resin Layer A long polyethylene terephthalate film with a thickness of 35 μm and a width of 480 mm was used as a carrier.

Using the apparatus having the configuration illustrated in FIG. 15(a), the carrier was coated with a resin varnish A by a comma coater and dried in an oven at 170° C. for 3.5 min to prepare an insulating resin layer with a thickness of 60 μm and a width of 410 mm such that it was in the center of the carrier in the width direction. This insulating resin layer side was laminated with a protective film (polyethylene), to prepare a long-strip carrier A with an insulating resin layer.

The insulating resin layer of the resulting carrier A with an insulating resin layer was measured for a dynamic viscoelasticity and then a melt viscosity (complex viscosity coefficient) of the insulating resin layer was 100 Pa·s at 120° C.

This melt viscosity was measured using a dynamic viscoelastic measurement apparatus (Paar Physica, UDS200) by a procedure where a disc sample with a diameter of 25 mm and a thickness of 0.8 mm was pinched by a jig and measurement was conducted while the sample was twisted at a frequency of 1 Hz under each temperature atmosphere with heating at 3° C./min.

The following melt viscosity was obtained for a resin layer after the resin varnishes B to D were coated as described above.

Resin varnish B: 25,000 Pa·s (80° C.)
Resin varnish C: 1,000 Pa·s (80° C.)
Resin varnish D: 11,000 Pa·s (130° C.)

(2) Preparation of a Long-Strip Carrier B with an Insulating Resin Layer

A long copper foil film with a thickness of 12 μm and a width of 480 mm was used as a carrier.

Using the apparatus having the configuration illustrated in FIG. 15(a), the carrier was coated with a resin varnish A by a comma coater and dried in an oven at 170° C. for 3 min to prepare an insulating resin layer with a thickness of 30 μm and a width of 410 mm such that it was in the center of the carrier in the width direction. This insulating resin layer side was laminated with a protective film (polyethylene), to prepare a long-strip carrier B with an insulating resin layer.

The insulating resin layer of the resulting carrier B with an insulating resin layer was measured for a dynamic viscoelasticity as described above and then a melt viscosity (complex viscosity coefficient) of the insulating resin layer was 100 Pa·s at 120° C.

The following melt viscosity was obtained for a resin layer after the resin varnishes B to D were coated as described above.

Resin varnish B: 25,000 Pa·s (80° C.)
Resin varnish C: 1,000 Pa·s (80° C.)
Resin varnish D: 11,000 Pa·s (130° C.)

3. Preparation of a Long-Strip Two-Side Prepreg with a Carrier (1) Preparation of a Long-Strip Two-Side Prepreg C with a Carrier A fiber cloth was a long-strip glass fabric (Unitika Glass Fiber Co., Ltd., "E10T-SK", width: 360 mm, grammage: 104 g/m$^2$).

The carriers with an insulating resin layer A and B prepared above were used as a first and a second carriers with an insulating resin layer, respectively.

Using the apparatus having the configuration illustrated in FIG. 15(b), the protective films in the first and the second carriers with an insulating resin layer were peeled off while the sides of the fiber cloth were laminated with the respective insulating resin layer sides of the carriers with an insulating resin layer such that the fiber cloth was in the center of the carrier in a width direction, and these were bonded using laminate rolls (24) at 60° C. under the condition of a vacuum degree of 10 Torr.

Here, in the inner region of the carrier with an insulating resin layer in the width direction, the insulating resin layer sides of the first and the second carriers with an insulating resin layer were bonded to both sides of the fiber cloth, and in the outer region of the fiber cloth in the width direction, the insulating resin layers of the first and the second carriers with an insulating resin layer were bonded to each other.

Then, the bonded product was heated by passing it through a transverse-conveying hot air oven maintained at 120° C. over 2 min for melting the insulating resin layers without applying any pressure, to prepare a long-strip two-side prepreg C with a carrier.

4. One-Step Preparation of a Laminated Board Using a Two-Side Prepreg with a Carrier

Example B1

A fiber cloth was a long-strip glass fabric (Unitika Glass Fiber Co., Ltd., "E10T-SK", width: 360 mm, grammage: 104 g/m$^2$).

As a two-side prepreg with a carrier, a couple of the two-side prepregs C with a carrier prepared above which had been wound up as two rolls were prepared and used as a first and a second two-side prepregs with a carrier.

Using the apparatus having the configuration illustrated in FIG. 15(b), the carriers in the first and the second two-side prepregs with a carrier 40,40 were peeled off to prepare a first and a second prepregs with a carrier 40a, 40b. These are laminated such that the exposed sides of the insulating resin layers faced the sides of the fiber cloth 21a, respectively, and the fiber cloth 21a was in the center of the carrier in the width direction, and the laminate was bonded at a pressure of 10 N/cm$^2$ using a pair of laminate rolls 24, 24 at 60° C. under the condition of a vacuum degree of 10 Torr.

Here, in the inner region of the prepregs with a carrier in the width direction, the insulating resin layer sides of the first and the second prepregs with a carrier 40a, 40b were bonded to the sides of the fiber cloth 21a, respectively, and in both outer regions of the prepregs with a carrier in the width direction, the insulating resin layers of the first and the second prepregs with a carrier 40a, 40b were bonded.

Then, the bonded product was heated by passing it through a transverse-conveying hot air oven maintained at 120° C. over 1 min and then at 200° C. over 10 min. During the heating, the insulating resin layers was melted without applying any pressure. Thus, a laminated board having a prepreg 44 with a carrier was prepared.

Comparative Example B1

A glass fabric (thickness: 94 μm, Nitto Boseki Co., Ltd., WEA-2116) was impregnated with a resin varnish as described in Examples, and dried in an oven at 150° C. for 2 min to prepare a long prepreg with a solid varnish content of about 50% by weight. This long prepreg was cut into square prepregs, 500 mm on a side. A copper foil film with a thickness of 12 μm and a width of 480 mm was cut into squares, 500 mm on a side, which was used as a carrier. After two prepregs were laminated, the laminate was sandwiched between the carriers, and the resulting laminate was pressed under a pressure of 4 MPa by a pair of hot platens with heating at 200° C. for 2 hours, to prepare a double-sided copper-clad laminated body with a thickness of 0.2 mm.

5. Evaluation

The laminated boards prepared in Example B1 and Comparative Example B1 were evaluated for their physical properties as described below. The results demonstrate that the laminated board of Example B1 exhibits higher thickness precision than that of Comparative Example B1. Furthermore, it is demonstrated that Example B1 exhibits good impregnation properties and connection reliability. The results further demonstrate that a laminated board exhibiting excellent thickness precision and insulation reliability can be provided when two or more two-side prepregs with a carrier are used for manufacturing a laminated board.

When the resin varnishes B to D were used, the results had similar tendency to those for Example B1.

Evaluation methods are as follows.

(1) Impregnation Properties

A laminated board having a prepreg with a carrier prepared in one of Examples was immersed in a fluorescent penetrant, and the presence of permeation by the fluorescent penetrant was checked by a microscope.

In addition, a laminated board having a prepreg with a carrier was treated with PCT (121° C./100%/120 min), and then immersed in a solder bath at 260° C. for 30 sec and then presence of swelling was checked.

(2) Thickness Precision

A cross section of a laminated board having a prepreg with a carrier in one of Examples was observed by a microscope to determine a thickness at three points at a pitch of 100 mm in a width direction, from which an average and a standard deviation were calculated.

The invention claimed is:

1. A method for manufacturing a laminated board, comprising:
    preparing a first carrier-attached-prepreg having a first insulating resin layer in which a fiber cloth is embedded, and a first carrier attached to the first insulating resin layer;
    preparing a second carrier-attached-prepreg having a second insulating resin layer in which a fiber cloth is embedded, and a second carrier attached to the second insulating resin layer; and
    laminating said first and second carrier-attached-prepregs by bonding said first insulating resin layer and said second insulating resin layer directly or via an additional member under reduced pressure to form a laminate of said first and second carrier-attached-prepregs, and by heating said laminate of first and second carrier-attached-prepregs,
    wherein the first carrier and the second carrier are separate from one another,
    wherein said preparing said first carrier-attached-prepreg comprises:

preparing a first two-side carrier-attached-prepreg having a carrier, an insulating resin layer in which a fiber cloth is embedded and another carrier which are laminated in sequence;

exposing said insulating resin layer of said first two-side carrier-attached-prepreg by removing the carrier in one side in said first two-side carrier-attached-prepreg, and wherein said preparing said second carrier-attached-prepreg comprises:

preparing a second two-side carrier-attached-prepreg having a carrier, an insulating resin layer in which a fiber cloth is embedded and another carrier which are laminated in sequence;

exposing said insulating resin layer of said second two-side carrier-attached-prepreg by removing the carrier in one side in said second two-side carrier-attached-prepreg, and wherein each of said preparing said first two-side carrier-attached-prepreg and said second two-side carrier-attached-prepreg, comprises:

preparing a first insulating-resin-layer-attached-carrier, the first insulating-resin-layer-attached-carrier including an insulating layer and a carrier attached to the insulating layer;

preparing a second insulating-resin-layer-attached-carrier, the second insulating-resin-layer-attached-carrier including an insulating layer and a carrier attached to the insulating layer;

bonding the insulating resin layer of the first insulating-resin-layer-attached-carrier and the insulating resin layer of the second insulating-resin-layer-attached-carrier via the fiber cloth under reduced pressure to form a laminate of the first and second insulating-resin-layer-attached-carriers; and heating the laminate of the first and second insulating-resin-layer-attached-carriers.

2. The method for manufacturing a laminated board as claimed in claim 1, wherein said laminate of first and second carrier-attached-prepregs is transported to a place under an atmospheric pressure and heated under the atmospheric pressure continuously.

3. The method for manufacturing a laminated board as claimed in claim 1, wherein the reduced pressure in said laminating said first and second carrier-attached-prepregs is 20 Torr or less.

4. The method for manufacturing a laminated board as claimed in claim 1, wherein a heating temperature in said laminating said first and second carrier-attached-prepregs is 60° C. or more and 200° C. or less.

5. The method for manufacturing a laminated board as claimed in claim 1, further comprising:

preparing, as said additional member, a film-shaped insulating resin member in which a fiber cloth is embedded before said laminating said first and second carrier-attached-prepregs, wherein said bonding said first and second insulating resin layers comprises:

bonding said first insulating resin layer to one side of said film-shaped insulating resin member under reduced pressure; and bonding said second insulating resin layer to the other side of said film-shaped insulating resin member under reduced pressure.

6. The method for manufacturing a laminated board as claimed in claim 1, further comprising:

preparing, as said additional member, two film-shaped insulating resin members each having a fiber cloth embedded therein before said laminating said first and second carrier-attached-prepregs, wherein said first and second insulating resin layers are bonded such that said first carrier-attached-prepreg, the two film-shaped insulating resin members and said second carrier-attached-prepreg are laminated under reduced pressure, and such that the carriers are the outermost layers.

7. The method for manufacturing a laminated board as claimed in claim 5, wherein said preparing said film-shaped insulating resin member comprises:

preparing a two-side carrier-attached-prepreg, the two-side carrier-attached-prepreg having a carrier, an insulating resin layer in which a fiber cloth is embedded and another carrier which are laminated in sequence; and exposing said insulating resin layer by removing the carriers in both sides of said two-side carrier-attached-prepreg.

8. The method for manufacturing a laminated board as claimed in claim 7, wherein said preparing said two-side carrier-attached-prepreg is prepared, comprises:

preparing a first insulating-resin-layer-attached-carrier, the first insulating-resin-layer-attached-carrier including an insulating layer and a carrier attached to the insulating layer;

preparing a second insulating-resin-layer-attached-carrier, the second insulating-resin-layer-attached-carrier including an insulating layer and a carrier attached to the insulating layer;

bonding the insulating resin layer of the first insulating-resin-layer-attached-carrier and the insulating resin layer of the second insulating-resin-layer-attached-carrier via a fiber cloth under reduced pressure to form a laminate of the first and second insulating-resin-layer-attached-carriers; and heating the laminate of the first and second insulating-resin-layer-attached-carriers.

9. The method for manufacturing a laminated board as claimed in claim 1, wherein the carrier and the insulating resin layer in said first and/or second insulating-resin-layer-attached-carrier are longer than said fiber cloth in a width direction.

10. The method for manufacturing a laminated board as claimed in claim 1, wherein in a vacuum laminator under reduced pressure, said insulating resin layer of said first insulating-resin-layer-attached-carrier is bonded to said insulating resin layer of said second insulating-resin-layer-attached-carrier via said fiber cloth.

11. The method for manufacturing a laminated board as claimed in claim 1, wherein the insulating resin layer of the first insulating-resin-layer-attached-carrier and the insulating resin layer of the second insulating-resin-layer-attached-carrier are bonded by being pressed by a pair of laminate rolls from the carrier side.

12. The method for manufacturing a laminated board as claimed in claim 1, further comprising:

preparing a third carrier-attached-prepreg having a insulating resin layer;

removing the carrier in at least one side-of said laminate of first and second carrier-attached-prepregs-to expose at least one of the first and second insulating resin layers after said first and second carrier-attached-prepregs are laminated;

bonding said exposed insulating resin layer with said insulating resin layer of the third carrier-attached-prepreg directly or via an additional member under reduced pressure to form a laminate of said first, second, and third carrier-attached-prepregs; and heating the laminate of said first, second, and third carrier-attached-prepregs.

13. The method for manufacturing a laminated board as claimed in claim 1, further comprising:

preparing a second laminate of carrier-attached-prepregs having insulating resin layers;

removing the carrier in at least one side-of said laminate of first and second carrier-attached-prepregs to expose at least one of the first and second insulating resin layers after said first and second carrier-attached-prepregs are laminated;

removing at least one of the carriers of said second laminate of carrier-attached-prepregs to expose at least one of the insulating resin layers;

bonding said exposed insulating resin layer of said laminate of first and second carrier-attached-prepregs with the exposed insulating resin layer of the second laminate of carrier-attached-prepregs directly or via an additional member under reduced pressure to form a third laminate; and heating the third laminate.

14. The method for manufacturing a laminated board as claimed in claim 12, wherein said additional member is a film-shaped insulating resin member in which a fiber cloth is embedded.

15. A method for manufacturing a laminated board where a first and a second long-strip carrier-attached-prepregs are continuously laminated, comprising:

preparing a first long-strip two-side carrier-attached-prepreg having a first insulating resin layer in which a fiber cloth is embedded and two carriers, one of the two carriers being attached to one surface of the first insulating resin layer, another of the two carriers being attached to another surface of the first insulating resin layer, each of the first insulating resin layer and the two carriers having a long-strip shape;

preparing a second long-strip two-side carrier-attached-prepreg having a second insulating resin layer in which a fiber cloth is embedded and two carriers, one of the two carriers being attached to one surface of the second insulating resin layer, another of the two carriers being attached to another surface of the second insulating resin layer, each of the second insulating resin layer and the two carriers having a long-strip shape;

peeling off said carrier in one side of said first long-strip two-side carrier-attached-prepreg to expose one side of said first insulating resin layer and to form the first long-strip carrier-attached-prepreg;

peeling off said carrier in one side of said second long-strip two-side carrier-attached-prepreg to expose one side of said second insulating resin layer and to form the second long-strip carrier-attached-prepreg;

bonding said first and second insulating resin layers directly or via an additional member under reduced pressure while pressing said first and second long-strip carrier-attached-prepregs to each other by a pair of laminate rolls to bond said first and second insulating resin layers together to form a laminate of said first and second long-strip carrier-attached-prepregs; and heating the laminate of said first and second long-strip carrier-attached-prepregs, wherein all of said preparing the first long-strip two-side carrier-attached-prepreg, said preparing the second long-strip two-side carrier-attached-prepreg, said peeling off said carrier in one side of said first long-strip two-side carrier-attached-prepreg, said peeling off said carrier in one side of said second long-strip two-side carrier-attached-prepreg, said bonding said first and second insulating resin layers, and said heating the laminate are continuously repeated, wherein a remaining carrier of the first long-strip carrier-attached-prepreg and a remaining carrier of the second long-strip carrier-attached-prepreg of the laminate are separate from one another, and wherein each of said preparing said first two-side long-strip carrier-attached-prepreg and said preparing said second two-side long-strip carrier-attached-prepreg, comprises:

preparing long-strip insulating-resin-layer-attached-carrier including an insulating layer and the one of the two carriers attached to the insulating layer;

preparing a second long-strip insulating-resin-layer-attached-carrier the second long-strip insulating-resin-layer-attached-carrier including an insulating layer and the another of the two carriers attached to the insulating layer;

bonding the insulating resin layer of the first long-strip insulating-resin-layer-attached-carrier and the insulating resin layer of the second long-strip insulating-resin-layer-attached-carrier via the fiber cloth under reduced pressure to form a laminate of the first and second long-strip insulating-resin-layer-attached-carriers; and heating the laminate of the first and second long-strip insulating-resin-layer-attached-carriers.

16. The method for manufacturing a laminated board as claimed in claim 15, wherein said laminate of said first and second long-strip carrier-attached-prepregs is heated under an atmospheric pressure.

17. The method for manufacturing a laminated board as claimed in claim 15, wherein said bonding said first and second insulating resin layers is conducted under a pressure of 20 Torr or less.

18. The method for manufacturing a laminated board as claimed in claim 15, wherein a laminate pressure during pressing by the pair of laminate rolls in said bonding said first and second insulating resin layers is 1 N/cm$^2$ or more and 50 N/cm$^2$ or less.

19. The method for manufacturing a laminated board as claimed in claim 15, wherein a heating temperature in said heating said laminate of said first and second long-strip carrier-attached-prepregs is 60° C. or higher and 200° C. or lower.

20. The method for manufacturing a laminated board as claimed in claim 15, wherein said laminated board has a thickness of 30 µm or more and 200 µm or less.

21. The method for manufacturing a laminated board as claimed in claim 15, further comprising, before said bonding said first and second insulating resin layers, preparing a third long-strip two-side carrier-attached-prepreg in which a carrier, a third insulating resin layer in which a fiber cloth is embedded and another carrier are laminated in sequence, and peeling off the carriers in both sides of said third two-side carrier-attached-prepreg to prepare a long-strip insulating resin member in which the third insulating resin layers are exposed in both sides, wherein said bonding said insulating resin layers comprises abutting said first insulating resin layer of said first long-strip carrier-attached-prepreg and said third insulating resin layer of said long-strip insulating resin member while abutting said insulating resin layer of said second long-strip carrier-attached-prepreg and said third insulating resin layer of said long-strip insulating resin member, under reduced pressure using said long-strip insulating resin member as said additional member.

22. The method for manufacturing a laminated board as claimed in claim 15, wherein said additional member is a long-strip fiber cloth.

23. The method for manufacturing a laminated board as claimed in claim 15, further comprising, before said bonding said first and second insulating resin layers,
preparing two long-strip insulating resin members, as said additional member, each of the two long-strip insulating resin members having a fiber cloth embedded in a longitudinal direction,
wherein said bonding said first and second insulating resin layers comprise abutting the first insulating rein layer, the two long-strip insulating resin layers and the second insulating resin layer such that both outermost layers are the carriers, under reduced pressure using said two long-strip insulating resin members as said additional member.

24. The method for manufacturing a laminated board as claimed in claim 15, further comprising, before said bonding said first and second insulating resin layers,
preparing, as said additional member, a long-strip fiber cloth and a long-strip insulating resin member in which a long-strip fiber cloth is embedded in a longitudinal direction,
wherein said bonding said first and second insulating resin layers comprises laminating said first long-strip carrier-attached-prepreg, said long-strip fiber cloth, said insulating resin member and said second long-strip carrier-attached-prepreg such that both outermost layers are the carriers, under reduced pressure using said long-strip fiber cloth and said insulating resin member as said additional member.

25. The method for manufacturing a laminated board as claimed in claim 15, wherein in said heating said laminate, substantially no pressure is applied to said laminate.

26. The method for manufacturing a laminated board as claimed in claim 15, wherein said bonding said first and second insulating resin layers is conducted within a vacuum laminator under reduced pressure.

27. The method for manufacturing a laminated board as claimed in claim 15, wherein said preparing said first and second long-strip two-side carrier-attached-prepregs comprises:
preparing a first long-strip insulating-resin-layer-attached-carrier, the first insulating-resin-layer-attached-carrier including an insulating layer and a carrier attached to the insulating layer;
preparing a second long-strip insulating-resin-layer-attached-carrier, the second insulating-resin-layer-attached-carrier including an insulating layer and a carrier attached to the insulating layer;
bonding the insulating resin layers of the first and second long-strip insulating-resin-layer-attached-carriers via a fiber cloth-under reduced pressure to form a laminate of the first and second long-strip insulating-resin-layer-attached-carriers; and
heating the laminate of the first and second long-strip insulating-resin-layer-attached-carriers.

28. The method for manufacturing a laminated board as claimed in claim 27, wherein a melt viscosity of the insulating resin contained in said insulating resin layers of said first and second long-strip insulating-resin-layer-attached-carriers is 0.1 MPa·s or less at 60° C. or more and 200° C. or less.

29. The method for manufacturing a laminated board as claimed in claim 27, wherein the carrier and the insulating resin layer of said first and/or second long-strip insulating-resin-layer-attached-carriers are longer than said fiber cloth in a width direction perpendicular to a longitudinal direction.

30. The method for manufacturing a laminated board as claimed in claim 29, wherein the insulating resin layer of the first long-strip insulating-resin-layer-attached-carriers and the insulating resin layer of the second long-strip insulating-resin-layer-attached-carrier are bonded such that in an inner region of said first and second long-strip insulating-resin-layer-attached-carriers in the width direction, the insulating resin layers of said first and second long-strip insulating-resin-layer-attached-carriers are bonded to the respective sides of said fiber cloth, and such that in both end regions of said first and second long-strip insulating-resin-layer-attached-carriers in the width direction perpendicular to the longitudinal direction, the insulating resin layers of said first and second long-strip insulating-resin-layer-attached-carriers are bonded such that said fiber cloth is sealed.

31. The method for manufacturing a laminated board as claimed in claim 27, wherein said heating comprises bonding said insulating resin layers of said first and second insulating-resin-layer-attached-carriers via said fiber cloth in a vacuum laminator under reduced pressure.

32. The method for manufacturing a laminated board as claimed in claim 27, wherein in said heating,
directly or via an additional member abutting said insulating resin layers of said first and second long-strip insulating-resin-layer-attached-carriers under reduced pressure and bonding said insulating resin layers by pressing them using the pair of laminate rolls.

33. The method for manufacturing a laminated board as claimed in claim 27, wherein during heating in said preparing a two-side carrier-attached-prepreg, substantially no pressure is applied.

34. The method for manufacturing a laminated board as claimed in claim 1, wherein said carrier is a metal foil.

35. The method for manufacturing a laminated board as claimed in claim 1, wherein said carrier is a film sheet which is treated to be peelable in the side contacting with said insulating resin layer.

* * * * *